(12) United States Patent
Ariyama

(10) Patent No.: US 8,397,135 B2
(45) Date of Patent: Mar. 12, 2013

(54) RECORDING APPARATUS AND RECORDING METHOD

(75) Inventor: Takeo Ariyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 256 days.

(21) Appl. No.: 12/957,440

(22) Filed: Dec. 1, 2010

(65) Prior Publication Data

US 2011/0131476 A1 Jun. 2, 2011

(30) Foreign Application Priority Data

Dec. 1, 2009 (JP) ................................. 2009-273837

(51) Int. Cl.
*G11C 29/00* (2006.01)
(52) U.S. Cl. ...................................................... 714/769
(58) Field of Classification Search .................. 714/758, 714/763, 769, 799; 369/18, 59
See application file for complete search history.

(56) References Cited

U.S. PATENT DOCUMENTS

| | | | | |
|---|---|---|---|---|
| 6,530,060 B1 * | 3/2003 | Vis et al. | ........................ | 714/792 |
| 6,763,495 B2 * | 7/2004 | Suzuki et al. | ................. | 714/781 |
| 7,065,702 B2 * | 6/2006 | Oren | .............................. | 714/807 |
| 7,126,898 B2 * | 10/2006 | Kuroda et al. | ............. | 369/59.25 |
| 7,406,654 B2 * | 7/2008 | Moriwaki | ...................... | 714/801 |
| 7,418,645 B2 * | 8/2008 | Srivastava | ...................... | 714/758 |
| 7,426,682 B2 * | 9/2008 | Peng et al. | ..................... | 714/799 |

FOREIGN PATENT DOCUMENTS

| | | |
|---|---|---|
| JP | 2006-244631 A | 9/2006 |
| JP | 2007-042234 A | 2/2007 |

* cited by examiner

*Primary Examiner* — Shelly A Chase

(74) *Attorney, Agent, or Firm* — Sughrue Mion, PLLC

(57) ABSTRACT

A recording apparatus includes a first operation unit that calculates an EDC intermediate value from first data in a first region at least including data to be read after an EDC when reading data in a second sequence in a first sector from a data buffer that stores a block, a data memory that stores at least part of the first data used for operation by the first operation unit, a second operation unit that reads data excluding the first data from the block as second data from the data buffer and calculates the EDC based on the second data and the EDC intermediate value, and an integration unit that integrates the first data, the second data and the EDC, wherein the integration unit receives the EDC and the second data from the second operation unit, receives the first data from the data memory, and integrates and outputs them.

32 Claims, 38 Drawing Sheets

| Column=0 | Q=0 | 1 | 2 | 3 | 4 | 5 | 6 | 7 | 8 | 9 | 10 | 11 | 12 | 13 | 14 | 15 | 16 | 17 | 18 | | | |
|---|---|---|---|---|---|---|---|---|---|---|---|---|---|---|---|---|---|---|---|---|---|---|
| Row=0 | 1 | 216 | 432 | 648 | 864 | 1080 | 1296 | 1512 | 1728 | 1944 | 108 | 324 | 540 | 756 | 972 | 1188 | 1404 | 1620 | 1836 | | | |
| 1 | 2 | 217 | 433 | 649 | 865 | 1081 | 1297 | 1513 | 1729 | 1945 | 109 | 325 | 541 | 757 | 973 | 1189 | 1405 | 1621 | 1837 | | | |
| 2 | 3 | 218 | 434 | 650 | 866 | 1082 | 1298 | 1514 | 1730 | 1946 | 110 | 326 | 542 | 758 | 974 | 1190 | 1406 | 1622 | 1838 | | | |
| 3 | 4 | 219 | 435 | 651 | 867 | 1083 | 1299 | 1515 | 1731 | 1947 | 111 | 327 | 543 | 759 | 975 | 1191 | 1407 | 1623 | 1839 | | | |
| 4 | 5 | 220 | 436 | 652 | 868 | 1084 | 1300 | 1516 | 1732 | 1948 | 112 | 328 | 544 | 760 | 976 | 1192 | 1408 | 1624 | 1840 | | | |
| 5 | 6 | 221 | 437 | 653 | 869 | 1085 | 1301 | 1517 | 1733 | 1949 | 113 | 329 | 545 | 761 | 977 | 1193 | 1409 | 1625 | 1841 | | | |
| 6 | 7 | 222 | 438 | 654 | 870 | 1086 | 1302 | 1518 | 1734 | 1950 | 114 | 330 | 546 | 762 | 978 | 1194 | 1410 | 1626 | 1842 | | | |
| 7 | | 223 | 439 | 655 | 871 | 1087 | 1303 | 1519 | 1735 | 1951 | 115 | 331 | 547 | 763 | 979 | 1195 | 1411 | 1627 | 1843 | | | |
| ... | | | | | | | | | | | | | | | | | | | | | | |
| 214 | | 214 | 430 | 646 | 862 | 1078 | 1510 | 1726 | 1942 | 106 | 322 | 538 | 754 | 970 | 1186 | 1402 | 1618 | 1834 | 2050 | | | |
| 215 | | 215 | 431 | 647 | 863 | 1079 | 1511 | 1727 | 1943 | 107 | 323 | 539 | 755 | 971 | 1187 | 1403 | 1619 | 1835 | 2051 | | | |

Fig. 2

EDC TABLE

EDC EXPECTED VALUE TABLE 1

| address | 0 | 1 | 2 | 3 | 4 | 5 | 6 | 7 |
|---|---|---|---|---|---|---|---|---|
| code | 0x8fa08bed | 0x41a33ca8 | 0x0340df67 | 0xa666e603 | 0x49002cf7 | 0x36e8e71a | 0x7b48481 | 0x8b87b3dd |
| address | 8 | 9 | 10 | 11 | 12 | 13 | 14 | 15 |
| code | 0xf77bff7d | 0x7ca028a5 | 0x67163d88 | 0x7ccfd441 | 0x0f234f45 | 0x7b715b71 | 0x85c9a104 | 0xd3530063 |
| address | 16 | 17 | 18 | | | | | |
| code | 0x25a529e9 | 0xa583cc03 | 0x884f780f | | | | | |

EDC EXPECTED VALUE TABLE 1 (E.G. CASE OF ROW=152)

| address | 0 | 1 | 2 | 3 | 4 | 5 | 6 | 7 |
|---|---|---|---|---|---|---|---|---|
| code | 0x5d675dff | 0x1d117775 | 0xe20ff0ad | 0x74726835 | 0xf444a0c5 | 0x783b8f2f | 0x15eaf235 | 0x80af5f77 |
| address | 8 | | | | | | | |
| code | 0x0000080f | | | | | | | |

*EDC EXPECTED VALUE TABLE 3 IS NOT SHOWN

Fig. 21

RECORDING APPARATUS AND RECORDING METHOD

INCORPORATION BY REFERENCE

This application is based upon and claims the benefit of priority from Japanese patent application No. 2009-273837, filed on Dec. 1, 2009, the disclosure of which is incorporated herein in its entirety by reference.

BACKGROUND

1. Field of the Invention

The present invention relates to a recording apparatus and a recording method with an improved recording speed of recording data on an optical disc.

2. Description of Related Art

FIG. 34 is a Blu-ray disc recording apparatus disclosed in Japanese Unexamined Patent Application Publication No. 2007-042234 (Ariyama). As shown in FIG. 34, the recording apparatus 101 includes a data buffer 102, a buffer controller 103, and an encoder 104. The data buffer 102 buffers user data transferred from a host (not shown). The host may be an audio-visual (AV) system, a personal computer (PC) or the like, and it directs the recording apparatus 101 to record user data or read out data recorded on a disc.

The buffer controller 103 controls reading of user data from the data buffer 102, and it reads necessary user data as appropriate and transfers the data to the encoder 104. To calculate an error detecting code (EDC), the recording apparatus according to the exemplary embodiment executes a process of calculating an EDC intermediate value from user data in the latter half of an even-number sector, i.e. about one-fourth of user data in a whole data block (which is referred to hereinafter as a path 1), and a process of calculating an EDC from the remaining three-fourth of user data and the EDC intermediate value (hereinafter as a path 2) in parallel. Therefore, the buffer controller 103 has a channel CH1 for reading, from the data buffer 102, and outputting the user data to be used for processing of the path 1 and a channel CH2 for reading and outputting the user data to be used for processing of the path 2.

The encoder 104 adds an EDC to the user data and scrambles the EDC-added user data. The encoder 104 then outputs the scrambled data (which is referred to hereinafter as recording data) and an ECC obtained from the recording data. The ECC and the recording data are then combined with a BIS code, modulated by 1-7PP, and finally recorded onto a disc.

The encoder 104 includes an EDC generator 131, which serves as a first operation unit, for executing the above-described processing of the path 1, an EDC table 132, and an EDC buffer 133. The encoder 104 further includes an EDC generator 134, which serves as a second operation unit, for calculating an EDC in the path 2. In the processing of the path 1, the EDC generator 131 performs operation by referring to the EDC table 132 and the EDC buffer 133. A result of the operation performed by the EDC generator 131 in the path 1 is an EDC intermediate value, which is described later. The EDC intermediate value is written back to the EDC buffer 133. In the processing of the path 2, the EDC generator 134 calculates an EDC by referring to the EDC table 132 and the EDC buffer 133 and writes the calculated EDC back to the EDC buffer 133.

The encoder 104 further includes an integration unit 135 that adds the EDC stored in the EDC buffer 133 to the user data which is read from the channel CH2 and outputs the EDC-added data. The encoder 104 also includes a scrambler 136 that scrambles the EDC-added data which is output from the integration unit 135 and a scramble value generator 137 that calculates a scramble value which is necessary when the scrambler 136 performs scrambling. The encoder 104 further includes a reordering buffer 138 that rearranges the scrambled data which is scrambled by the scrambler 136 into the sequence in a recording frame direction P. The integration unit 135, the scrambler 136, the scramble value generator 137, and the reordering buffer 138 constitute a scramble processing unit that calculates recording data based on the user data and the EDC and outputs the data.

Further, the encoder 104 includes an ECC generator 139 that generates an ECC from the scrambled data and an ECC buffer 140 that buffers the ECC generated by the ECC generator 139. The data read out from the reordering buffer 138 in the sequence of the recording frame direction P is output as recording data. Further, the data of the ECC buffer 140 is output as ECC parity. The recording data and the ECC parity are output to an integration unit, which is not shown, where the recording data is rearranged in rows and columns, an ECC is added thereto, and then the data is interleaved, thereby creating an ECC cluster.

Further, in another encoding device that generates a BIS (a BIS encoding device), which is not shown, an access block is generated from user control data and an address unit number, and a BISECC is also generated. Then, the access block and the BISECC from the BIS encoding device are also supplied to the integration unit, thereby creating a BIS block. The BIS block is further interleaved to create a BIS cluster. Then, an ECC cluster is created by integrating the BIS cluster with an LDC cluster, and further a physical cluster is created by adding a frame sync and a DSV control bit. Then, 17-PP modulation is made on a recording frame and run-in and run-out are added, so that a recording unit block RUB is created. After that, data recording onto a disc is executed through a disc controller, using RUB as unit of recording.

Incidentally, for a Blu-ray disc, there is a code which needs to be generated before data recording. Then, because the recording is done on the fly, the code generation and the recording are executed in parallel. For the code generation and the recording, data access of one cluster each, i.e. two clusters in total, to a data buffer is generally required. On the other hand, in the technique disclosed in Ariyama, the code generation can be done with data access of only 0.25 cluster to a data buffer by an inventive code generation method. Access to the data buffer in the code generation and the recording is thereby reduced to 1.25 cluster, thus enabling compatibility with high speed operation.

To achieve high speed encoding, a high-cost data buffer that operates with a high frequency operating clock is required, which further increases power consumption. In view of this, according to Ariyama, the first operation unit and the second operation unit are provided as described above. For an even-number sector (operation target sector) having a structure in which an EDC is added at the end of the sector when reading in the sequence of a user data direction Q as a first sequence, and an EDC is added in the middle of reading the sector when reading in the sequence of a recording frame direction P, for example, which is different from the user data direction Q, the first operation unit calculates an EDC intermediate value from the latter half, which is a part of the sector. This processing is called the path 1. Note that, for an odd-number sector, the first operation unit does not generate an EDC intermediate value. The second operation unit calculates an EDC of the even-number sector from the remaining part of the even-number sector excluding the above part and the EDC intermediate value. An EDC of the odd-number sector is generated from data of the odd-number sector as a whole. The processing is called the path 2. By calculating the EDC using those two operation units, the amount of data access to the data buffer is reduced. This enables further improvement of encoding specification and achieves lower power consumption and lower costs.

FIG. 35 is a view to illustrate user data used in the paths 1 and 2 in Ariyama. The data block, which is a unit of processing in the encoder, has the even-number sector and the odd-number sector described above. In Ariyama, the data block is read out in the user data direction Q as the first sequence in the path 1. On the other hand, in the path 2, the data in the user data direction Q is rearranged into the sequence of the recording frame direction P. The reordering buffer is used at this time. The reordering buffer has a size of m bytes, which is the same as a burst transfer size of the data buffer, in the column direction, and 304 bytes, which is one cluster, in the row direction, for example. In the reordering buffer, data in the user data direction Q is stored m bytes each, for 304 bytes in the recording frame direction P. After that, the data is read out in the recording frame direction P, so that the data in the user data direction Q can be rearranged into the data in the sequence of the recording frame direction P.

As shown in FIG. 35, the even-number sector is a code string to which an EDC is added before the entire sector is transferred. Thus, in the path 1, operation of a part of the even-number sector being the operation target sector in the path 2, which is the latter half of the even-number sector to be read out after the timing to add an EDC, is executed to calculate an EDC intermediate value. In the path 2, operation of the remaining part of the even-number sector and the entire part of the odd-number sector is executed to calculate an EDC. Because the odd-number sector is a code string (non-operation target sector) having a structure in which an EDC is added at the end of the sector in any case of when data is read out in the sequence of the user data direction Q or when the user data of the burst transfer size m in the sequence of the user data direction Q is read out in the sequence of the recording frame direction P, it is not necessary to calculate an EDC intermediate value in advance in the path 1.

In this manner, the technique of Ariyama generates the EDC intermediate value by reading only a part of the even-number sector, rather than generating the EDC by reading one whole cluster in advance. The technique then calculates the EDC at the same time as when reading and recording one cluster in the path 2. As described earlier, because the EDC can be generated only after reading all data in the case of calculating the EDC at the same time, it is impossible for the even-number sector to generate the EDC while recording. Therefore, the technique enables the calculation of the EDC while performing the recording through use of the EDC intermediate value, which is an operation value generated only from a part for which the recording cannot be made in time. Note that the EDC intermediate value is described later.

As described above, the recording apparatus disclosed in Ariyama can generate the EDC and record data by access of about 1.25 cluster, not 2 clusters.

SUMMARY

Blu-ray standard data is recorded in units of clusters. One cluster is made up of 498 frames. Because 2 frames are used for gap at the time of recording, the substantial part of data is 496 frames. Further, user data is recorded in the first 432 frames, and an ECC generated from the user data is recorded in the latter 64 frames. With use of static random access memory (SRAM) (which is also referred to hereinafter as an ECC buffer), the ECC can be generated from the recorded data of the 432 frames and stored. Thus, the need for access to the data buffer is eliminated by using the ECC stored in the ECC buffer during the recording period of the latter 64 frames.

FIG. 36 is a timing chart according to related art. Although the code generation and the recording are executed in parallel, either one can access the data buffer. Therefore, the code generation and the recording access the data buffer in an alternate manner. Assuming that the buffer access from the code generation and the recording occurs at equal intervals, because the processing of reading the ECC from the ECC buffer and recording it is performed in the latter 64 frames in the recording, it is not necessary to access the data buffer for the recording process. Thus, only the buffer access necessary for the code generation is made in those frames. On the other hand, in the first 432 frames where user data to be recorded exist, the need to access the data buffer arises both for the recording and the code generation, which causes a problem that the buffer access is concentrated.

On the other hand, the latter 64 frames during the ECC recording period are only approximately 13% as a ratio of one cluster. Further, while the ECC data recorded during the approximately 13% period is 9728 bytes (about 10 Kbytes), the amount of buffer access to the data buffer during the code generation is about 15 Kbytes. Therefore, if the access to the data buffer by the code generation is concentrated only in the latter 64 frames, the user data of about 15 Kbytes is read out for the code generation during the recording of ECC data of 9728 bytes. Accordingly, the buffer access during this period takes a higher load than for the first 432 frames, and the latter 64 frames act as a bottleneck of the buffer access, which hinders the achievement of high speed recording (cf. FIG. 37).

Further, it is assumed that, in the latter 64 frames during the ECC recording period, only 9728 bytes of 15 Kbytes which are required for the code generation are processed, and user data is read out by the buffer access. Then, the buffer access may be made for the remaining about 5 Kbytes by uniformly thinning out them during the buffer access of the recording data for the first 432 frames. However, the problem that the code generation and the recording are performed in parallel and the need for the buffer access occurs simultaneously cannot be solved, and the buffer access for the first 432 frames takes a high load in this case, which still hinders the achievement of high speed recording.

Therefore, in the case where the buffer access in the code generation and the buffer access in the recording are performed in parallel as described in Ariyama, even if the code generation is performed concentrically during the ECC recording period, it hinders the achievement of high speed recording.

As described above, in the field of an optical disc recording apparatus such as a Blu-ray disc, the demand for high speed recording is increasing with the need to perform data backup in a short time.

A first exemplary aspect of the present invention is a recording apparatus that calculates an error detecting code (EDC) for detecting an error in a user data code string having a first sequence, where a unit of processing is a block including two or more sectors containing the user data code string, the block including a first sector and a second sector, the first sector and the second sector having a structure that the error detecting code is appeared in an end of the user data code string when reading data in the first sequence, and the first sector having a structure that the error detecting code is appeared in a middle of reading the user data code string when reading data in a second sequence different from the first sequence, the recording apparatus including a first operation unit that reads first data in a first region at least including data to be read out after the error detecting code when reading data in the second sequence in the first sector from a data buffer that stores the block and calculates an error detecting code intermediate value from the first data, a data memory that stores at least part of the first data used for operation by the first operation unit, a second operation unit that reads data excluding the first data in the first region from the block as second data from the data buffer and calculates an error detecting code based on the second data and the error detecting code intermediate value, and an integration unit that integrates the first data, the second data and the error detecting code, wherein the integration unit receives the error detecting code and the second data from the second operation unit, receives the first data from the data memory, and integrates and outputs the received error detecting code and the first and second data. The first sequence may be a sequence of a user data direction, for example, and the second sequence may be a sequence of a recording direction, for example.

A second exemplary aspect of the present invention is a recording method of calculating an error detecting code for detecting an error in a user data code string having a first sequence, where a unit of processing is a block including two or more sectors containing the user data code string, the block including a first sector and a second sector, the first sector and the second sector having a structure that the error detecting code is appeared in an end of the user data code string when reading data in the first sequence, and the first sector having a structure that the error detecting code is appeared in a middle of reading the user data code string when reading data in a second sequence different from the first sequence, the recording method including reading first data in a first region at least including data to be read out after the error detecting code when reading data in the second sequence in the first sector from a data buffer that stores the block, and calculating an error detecting code intermediate value from the first data, reading data excluding the first data in the first region from the block as second data from the data buffer and calculating an error detecting code based on the second data and the error detecting code intermediate value, and receiving the error detecting code and the second data, receiving the first data from a data memory that stores at least part of the first data used for operation, and integrating and outputting the received error detecting code and the first and second data.

In the exemplary aspects of the present invention, the code generation process calculates the EDC intermediate value from the first main data and further stores at least part of the same into the data memory. Then, the recording process reuses the data stored in the data memory without reading out all user data of the block, which is a unit of processing, thereby reducing the amount of access to the data buffer.

According to the exemplary aspects of the present invention described above, it is possible to provide a recording apparatus and a recording method that enable high speed recording.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 2 is a view showing two sectors Sec0 and Sec1 in an enlarged scale;

FIG. 21 is a view showing expected values (EDC expected value tables 1 and 2) at Row=0, 152;

DETAILED DESCRIPTION OF THE EXEMPLARY EMBODIMENTS

Exemplary embodiments of the present invention are described hereinafter in detail with reference to the drawings. In the exemplary embodiments, the present invention is applied to an optical disc recording apparatus capable of higher speed recording of Blu-ray standard data by storing data acquired at the time of code generation and reusing the data at the time of recording to address the problem of a shortage of a band due to concentration of buffer access to a data buffer, which has been the issue of related art.

It should be noted that, although a recording apparatus that records data conforming to the Blu-ray standard is described in the following description, the present invention is applicable to any data recording apparatus in which a recording direction and a user data direction are different, not limited to the Blu-ray standard.

Figure 1:
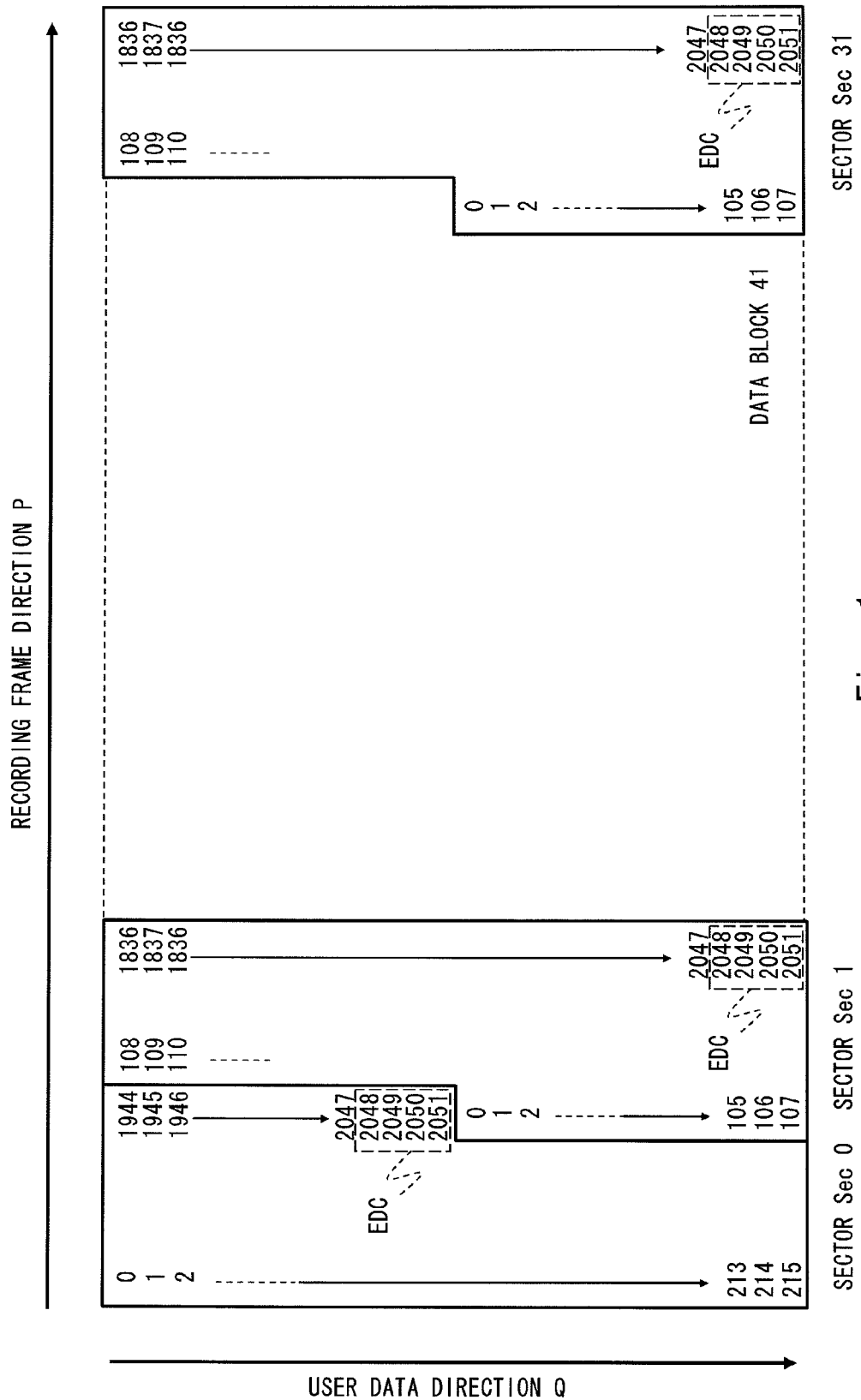
FIG. 1 is a view to illustrate arrangement of data in units of bytes in an LDC block of a Blu-ray disc.

FIG. 1 is a view to illustrate arrangement of data in units of bytes in a data block of a Blu-ray disc. FIG. 2 is a view showing two sectors Sec0 and Sec1 in an enlarged scale. The numerical values illustrated therein indicate the sequence of the user data direction Q in units of bytes. The data block is made up of 304 columns by 216 rows. The data block is composed of 32 sectors. One sector includes data of 2052 bytes, in which an EDC of 4 bytes is added to user data of 2048 bytes.

Each sector has block data in which 216-byte data are arranged in each of 304 columns. If Row indicates a row number ($0 \leq \text{Row} \leq 215$) and Column indicates a column number ($0 \leq \text{Column} \leq 303$), in the sector Sec0, for example, the column Column=9 has byte data of Q=1944 to 2051, which occupies the rows Row=0 to 107. The rows Row=108 to 215 in the column Column=9 are occupied with byte data of Q=0 to 107 of the next sector Sec1. In this manner, in the data block, an even-number sector (including 0) and an odd-number sector form one unit (which is also referred to hereinafter as an area), and the data is arranged repeatedly in the same sequence in each area composed of two sectors having 19 columns.

In the sectors Sec0 to Sec31, predetermined operation is performed in the sequence of the user data direction Q shown in FIGS. 1 and 2, so that an EDC is added and the data is scrambled, and then the data is modulated or the like and recorded onto a disc. At the time of the recording, the data block is recorded in the sequence of the recording frame direction P indicated by the arrow in FIG. 1, which is perpendicular to the column direction in the user data direction Q. The user data direction Q coincides with the direction of a processing sequence at the time of EDC addition an encoding processing sequence at the time of scrambling in a Blu-ray disc. Note that, the user data and the EDC may be scrambled separately and then integrated together, as described later.

As described above, because data is recorded on a Blu-ray disc in the recording frame direction P, it is necessary to rearrange the data in the sequence of the user data direction Q, which is the encoding processing sequence, into the sequence of the recording frame direction P by the time of the modulation. If the encoding is executed in the sequence of the recording frame direction P, it is unable to calculate an EDC because the EDC is added prior to reading all user data of the entire sector in even-number sectors, whereas the EDC is to be calculated from all user data of the sector as shown in FIG. 1. Consequently, data to which the EDC is added cannot be generated.

In view of the above, in the case where the user data direction Q being the sequence of user data (i.e. the normal encoding sequence) and the recording frame direction P being the sequence of data recording on a disc are different as in the Blu-ray disc, it is generally necessary to calculate an EDC or the like, add the EDC, and then rearrange and record the data. In such a case, the data rearrangement is generally made by temporarily storing the EDC-added data into a data buffer; however, it is necessary to use SRAM, which is expensive, for the data buffer in order to achieve high-speed operation, which is not practical.

To address this concern, the inventors of the present invention disclose, in Japanese Unexamined Patent Application Publication No. 2006-244631 (which is referred to hereinafter as a reference 1) that was filed in the name of the inventors, the invention that provides a reordering buffer having a memory capacity of a transfer size m of each burst transfer or the like×304 bytes×2 planes (for writing and reading), an ECC buffer (9728 bytes×2 planes) that temporarily stores ECC parity, an EDC buffer (4 bytes×32×2 planes) that temporarily stores an EDC code, and a scramble buffer (38 bytes×2 planes), and enables high speed data transfer for the reordering buffer by processing of temporarily storing an EDC, a scramble intermediate value, and an ECC obtained by encoding in the user data direction Q (path S1'), and processing of adding the EDC to user data and scrambling the data, with repeated burst-transfer of the user data from the data buffer (path S2').

According to the above reference 1, the reordering buffer is composed of a memory with no need of refreshing and capable of random access, thereby enabling high speed reordering of successive data obtained by burst transfer from the data buffer into the sequence of the recording frame direction P. In this case, even when the reordering buffer has a smaller capacity than the memory capacity of the data buffer, it is possible to perform scrambling on the data reordered into the sequence of the recording frame direction P by using operation results with use of the EDC, the scramble intermediate value and the ECC which have been calculated in the path S1' and stored.

Therefore, although the encoding with high speed recording cannot be achieved hitherto without use of a temporary memory device capable of high speed random access such as an expensive SRAM as the data buffer, low cost encoding is enabled in the exemplary embodiment of the present invention by addition of a relatively small scale circuit even with use of an inexpensive synchronous dynamic random access memory (SDRAM) or the like, which is unsuited for high speed random access, as the data buffer.

It should be noted that, for encoding of one cluster, it is necessary to read data of two clusters into the data buffer for coding and rearrangement. To record data in the recording frame direction P, it is necessary to read data of one cluster (2048 bytes×32 sectors) in the user data direction Q in advance just for EDC generation, which leads to an increase in power consumption due to an increase in absolute access to the data buffer.

On the other hand, according to Ariyama (which is referred to hereinafter as a reference 2), access to the data buffer at the time of code generation is reduced to 0.25 cluster, so that access to the data buffer is 1.25 in total, while 2 clusters have been needed originally. By reducing the data buffer access which can act as a bottleneck of encoding in this manner, it is possible to achieve high speed encoding and suppress power consumption.

On the other hand, according to the exemplary embodiment, concentration of access to the data buffer is avoided by preventing buffer access for code generation and buffer access for recoding from occurring during the same period.

As described above, the reference 2 has a problem that, when writing data of one recording unit (cluster) of Blu-ray standard data onto an optical disc, buffer access occurs concentrically and data reading from the data buffer cannot be completed within the period at the time of high speed recording. This is because the code generation and the recording are performed in parallel, access to the data buffer is need for the both processing. Further, because the data recording is concentrated on the first 432 frames, the buffer access cannot be made in time even when the code generation is performed during the first 432 frames or during the latter 64 frames.

In view of the foregoing, according to the exemplary embodiment, in an apparatus that records data in a recording direction different from the user data direction onto an optical disc, concentration of buffer access is reduced to enable high speed recording by storing data acquired at the time of code generation into a data memory and, when the relevant data is stored in the data memory at the time of recording, acquiring the data from the data memory, not making buffer access to the data buffer, and generating an EDC intermediate value during the ECC recording period.

Comparison Between Exemplary Embodiment and Reference 2

Figure 3:
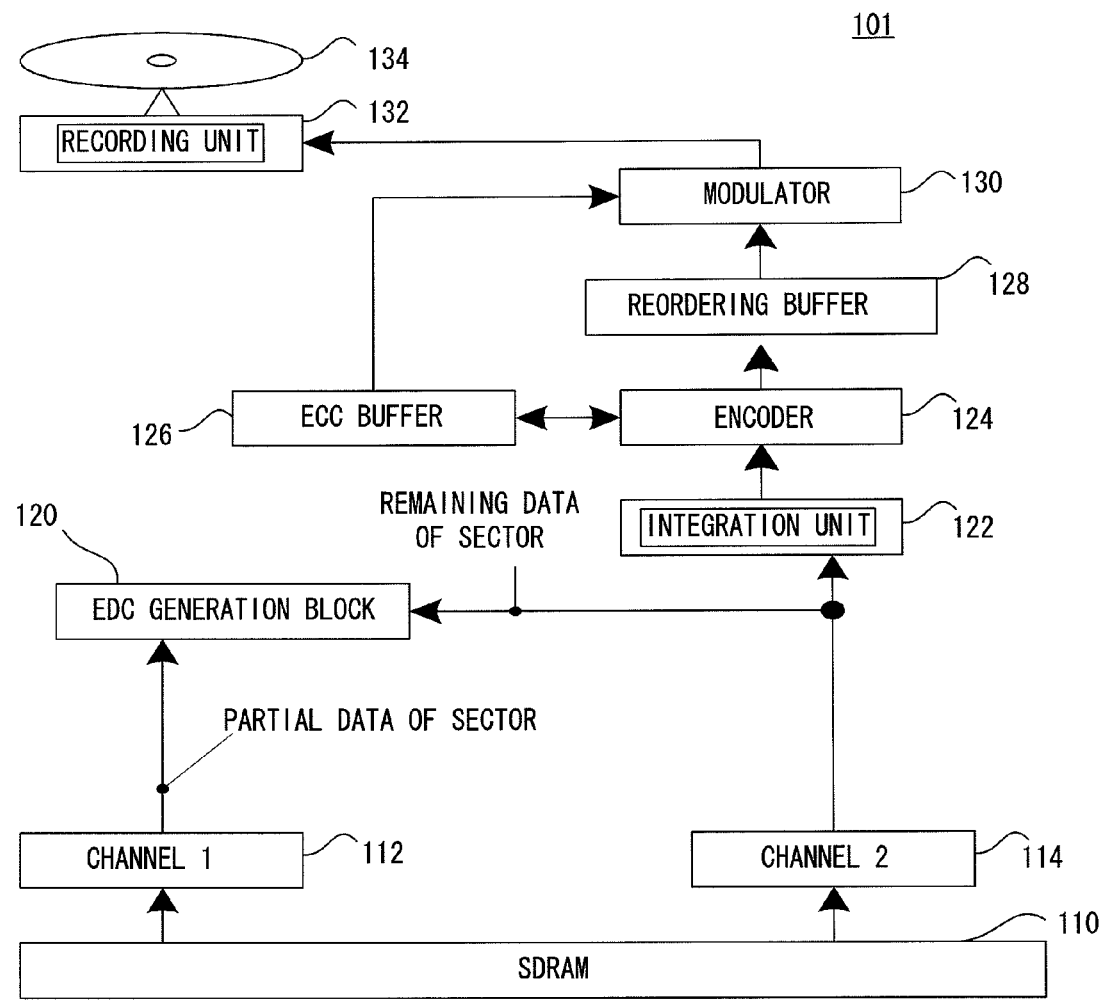
FIG. 3 is a view showing a recording apparatus described in a reference 2.
Figure 4:
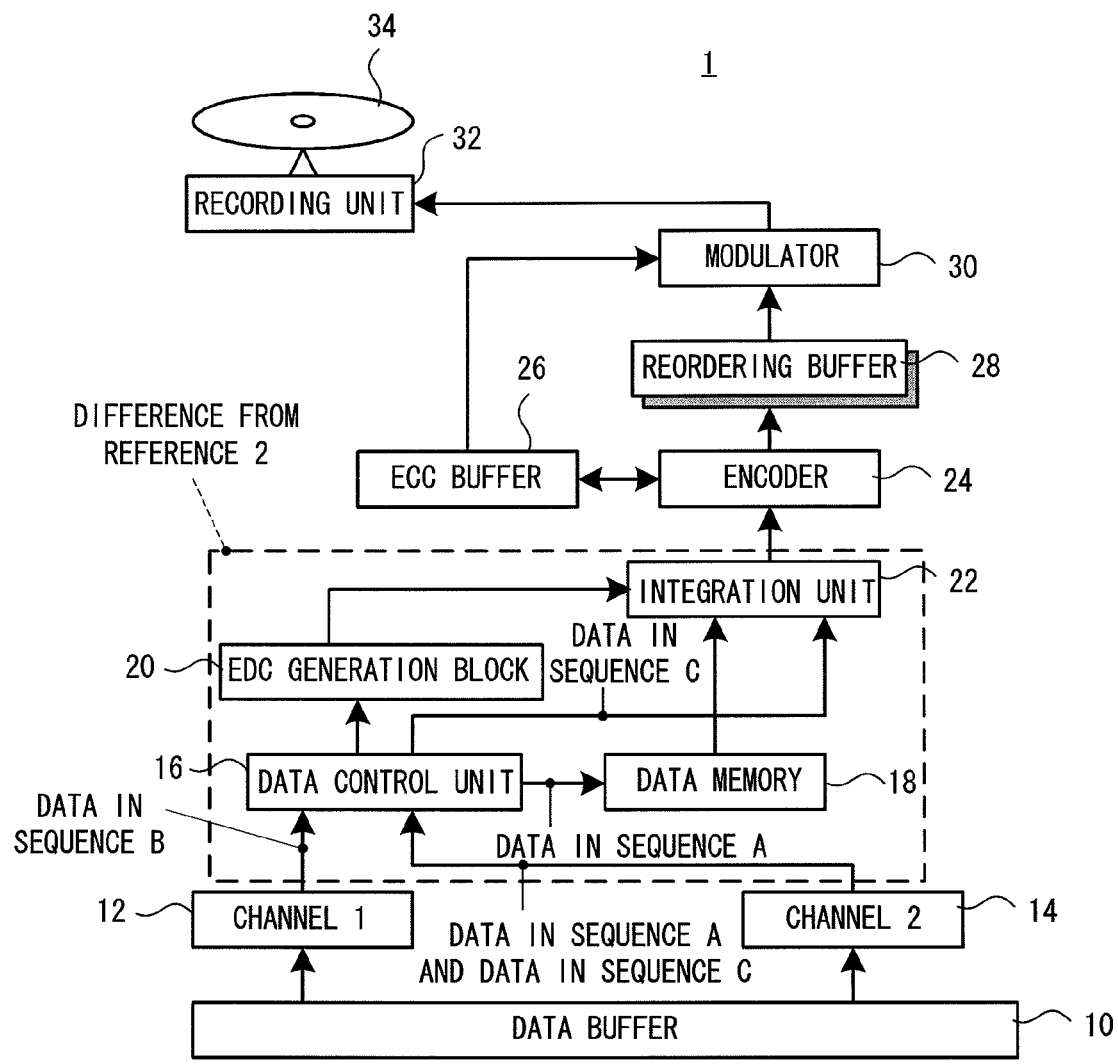
FIG. 4 is a view showing an overview of a recording apparatus according to an exemplary embodiment.
Figure 5:
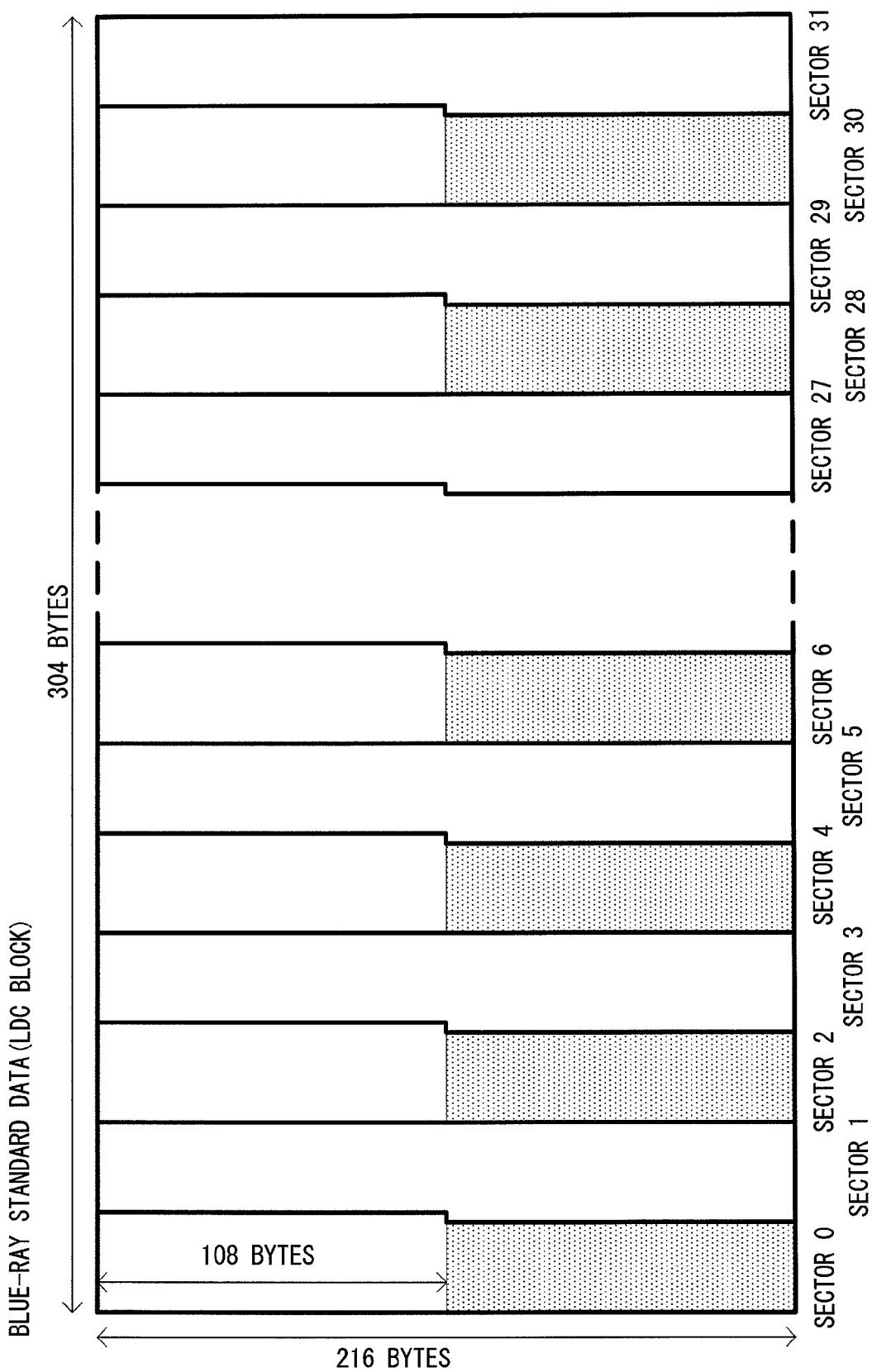
FIG. 5 is a view showing data to be accessed at the time of code generation in the reference 2.
Figure 6:
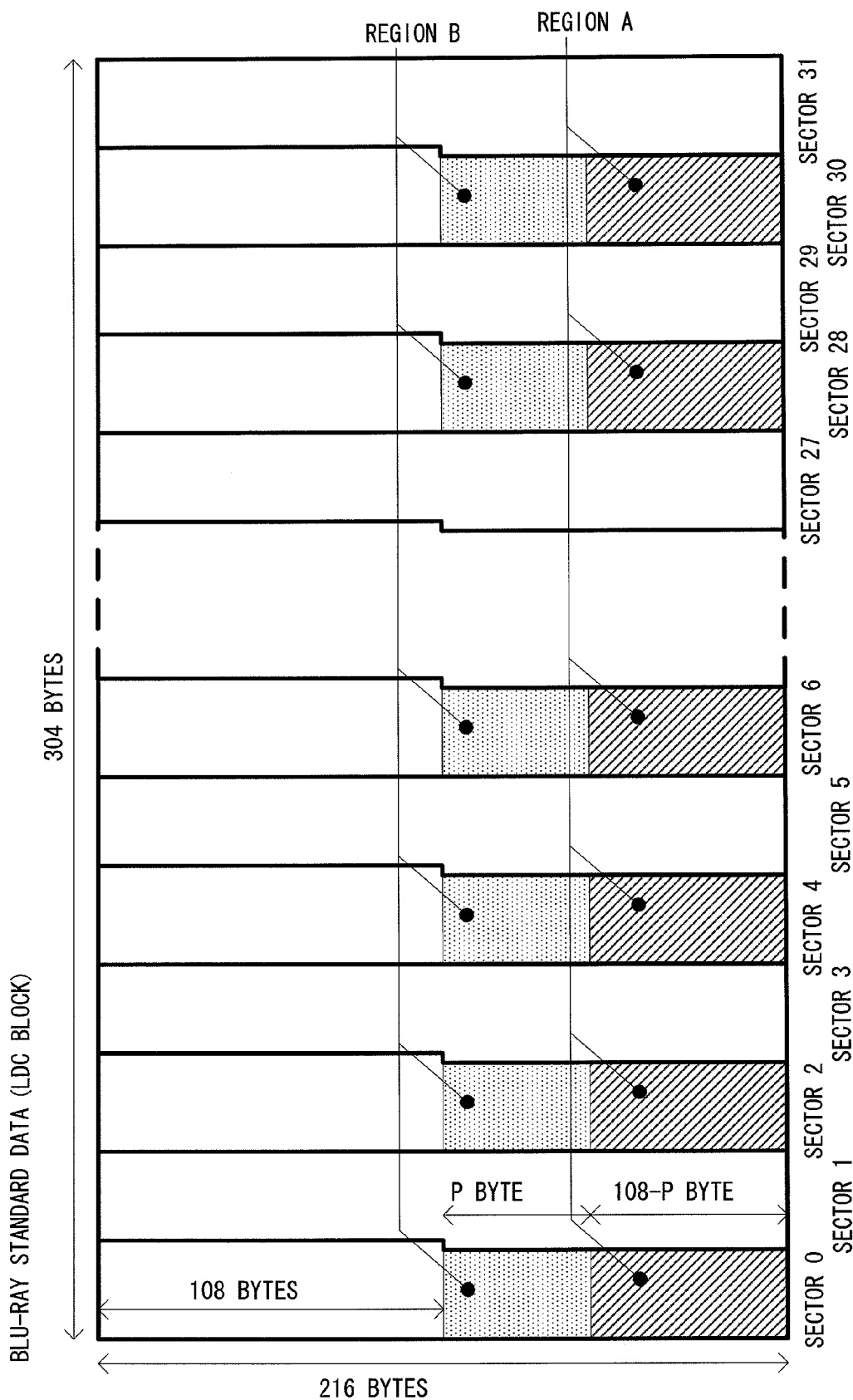
FIG. 6 is a view showing data to be accessed at the time of code generation in a first exemplary embodiment of the present invention.
Figure 7:
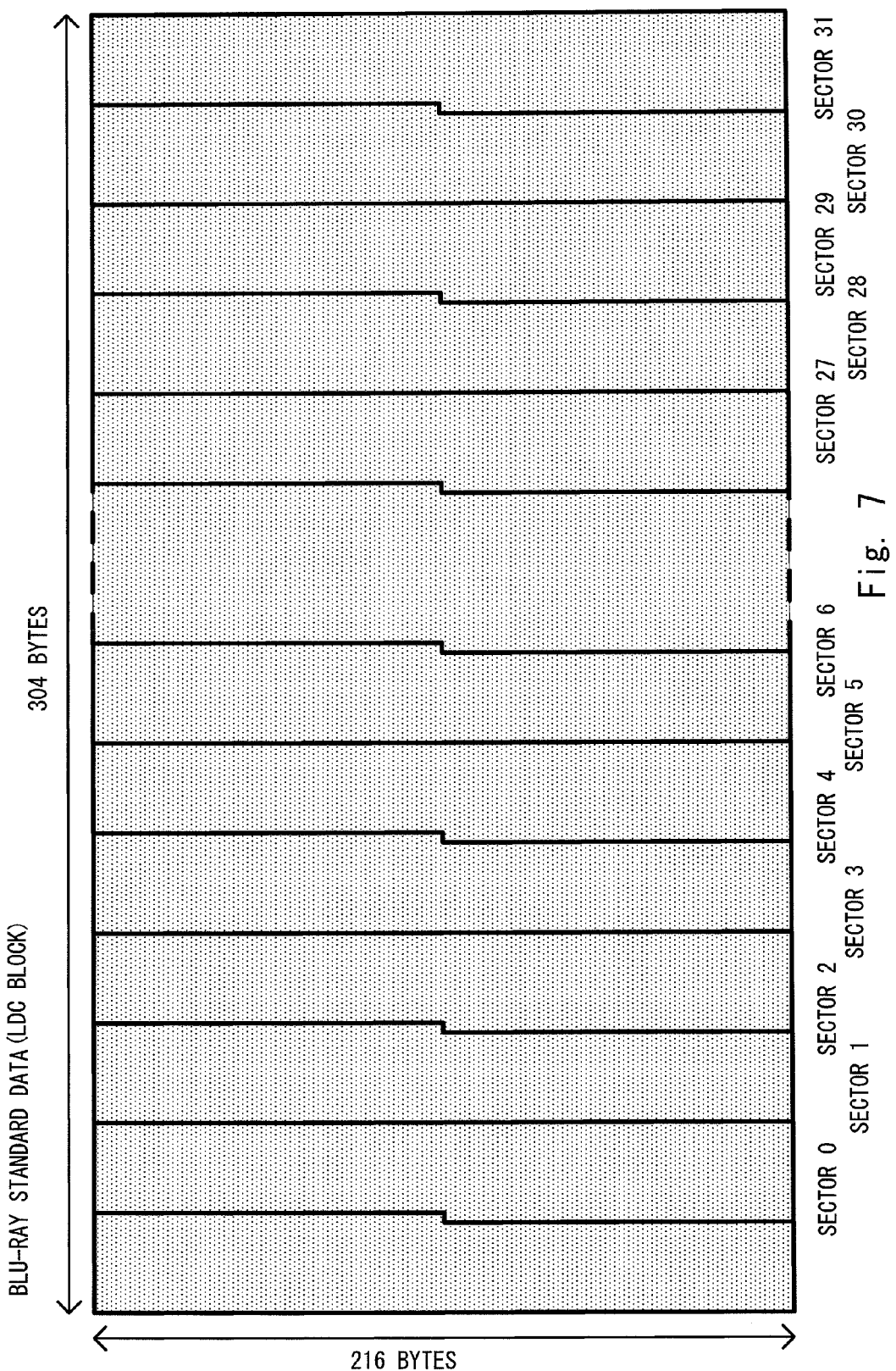
FIG. 7 is a view showing data to be accessed at the time of recording in the reference 2.
Figure 8:
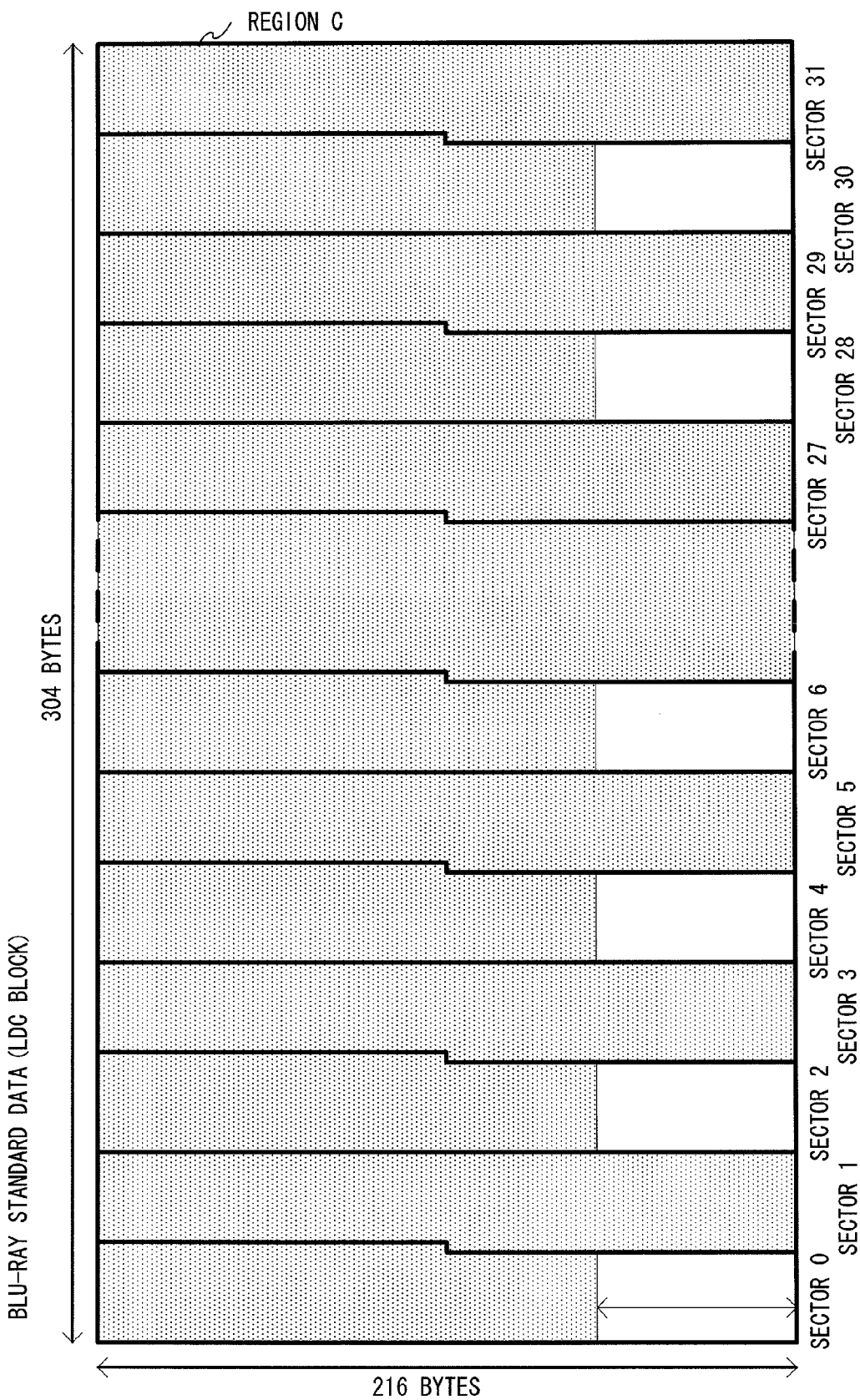
FIG. 8 is a view showing data to be accessed at the time of recording in the first exemplary embodiment of the present invention.
Figure 9A:
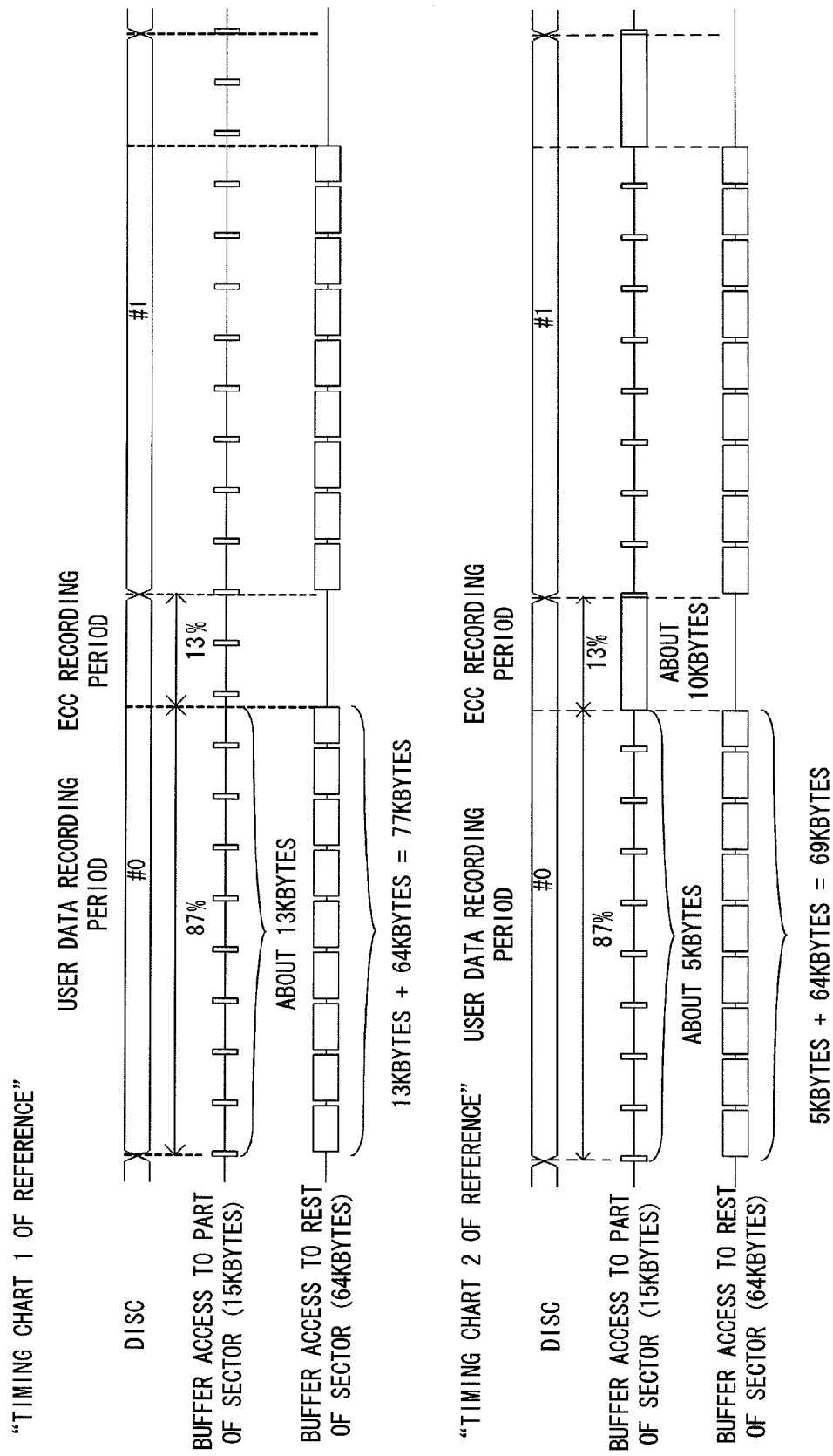
FIGS. 9A and 9B show timing charts of data access to a data buffer in the reference 2 and in the exemplary embodiment.
Figure 9B:
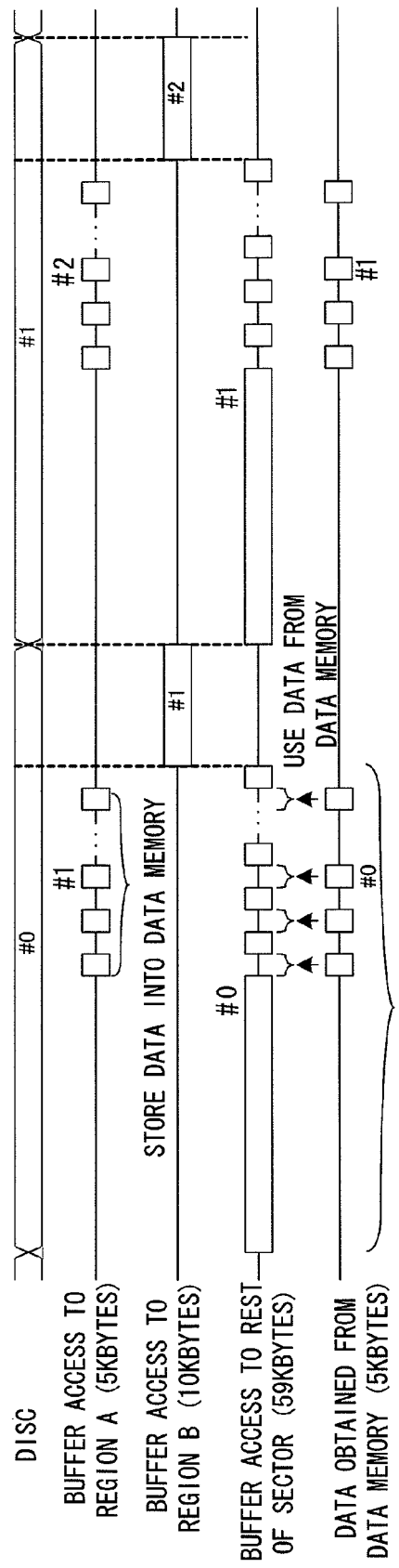

Hereinafter, the exemplary embodiment is described by comparison with the recording apparatus according to the reference 2 for easier understanding of the exemplary embodiment. In the reference 2, because buffer access for EDC intermediate value generation and buffer access for user data recording are performed in parallel, the user data recording period during which the two processing are concentrated acts as a bottleneck of data traffic, which causes an obstacle to higher speed. FIG. 3 is a view showing the recording apparatus disclosed in the reference 2, and FIG. 4 is a view showing an overview of the recording apparatus according to the exemplary embodiment. FIG. 5 is a view showing data to be accessed at the time of code generation in the reference 2, and FIG. 6 is a view showing data to be accessed at the time of code generation in the exemplary embodiment. FIG. 7 is a view showing data to be accessed at the time of recording in the reference 2, and FIG. 8 is a view showing data to be accessed at the time of recording in the exemplary embodiment. FIGS. 9A and 9B show timing charts of data access to the data buffer in the reference 2 and in the exemplary embodiment.

Note that the processing from the encoder to the recording unit is the same between the reference 2 and the exemplary embodiment. Specifically, an encoder 124, 24 scrambles user data to which an EDC is added. Then, the encoder 124, 24 outputs the scrambled data (which is referred to hereinafter as recording data) to a reordering buffer 128, 28. Further, the encoder 124, 24 generates an ECC after scrambling the EDC-added data and stores the ECC into an ECC buffer. After that, the ECC and the recording data are combined with a BIS code and modulated by 1-7PP in a modulator 130, 30, and then recorded onto a disc 134, 34 by a recording unit 132, 32.

A recording apparatus 101 according to the reference 2 includes a data buffer 110, a channel 1 (112), a channel 2 (114), an EDC generation block 120, and an integration unit 122. In the recording apparatus 101 according to the reference 2, the channel 1 (112) reads out part of data of an even-number sector indicated by hatching in FIG. 5 and generates an EDC intermediate value at the time of code generation, and the channel 2 (114) reads out all data of the block indicated by hatching in FIG. 7 and generates an EDC using the EDC intermediate value and further records the data at the time of recording. In this case, a case of reading data necessary for code processing from the data buffer by dividing them at an equal rate during the recording period (FIG. 9A) and a case of reading data of about 10 Kbytes which is the same as the amount of recording of the ECC from the data buffer during the ECC recording period and then reading the remaining user data by dividing them at an equal rate during the user data recording period because there is no access to the data buffer during the ECC recording period (FIG. 9B) are possible. However, in any of the case of FIG. 9A and the case of FIG. 9B, while the code processing reads data from the data buffer, access is made to the data buffer concurrently with the user data recording processing during the user data recording period, thus still having a problem that the recording and the coding cannot be completed within a predetermined time.

On the other hand, the optical disc recording apparatus 1 according to the exemplary embodiment includes a data buffer 10, a channel 1 (12), a channel 2 (14), a data control unit 16, a data memory 18, an EDC generation block 20, and an integration unit 22. The recording apparatus 1 further includes an encoder 24, an ECC buffer 26, a reordering buffer 28, a modulator 30, and a recording unit 32 that records data onto a disc 34. In this exemplary embodiment, a region A and a region B shown in FIG. 6 are used at the time of code generation. Further, a region C shown in FIG. 8 is used at the time of recording.

The data buffer 10 is a buffer that stores data for recording user data, and it is composed of SDRAM capable of burst transfer, for example. The channel 1 (12) acquires data of the region B from the data buffer 10. The channel 2 (14) acquires data of the region A and the region C from the data buffer 10. The data control unit 16 performs control related to data acquisition for EDC intermediate value generation and recording processing. The data memory 18 stores the data of the region A and outputs it as recording data to the integration unit 22. The EDC generation block 20 generates an EDC intermediate value from the data of the region A and the data of the region B, and generates an EDC from the EDC intermediate value and the data other than the regions A and B. The integration unit 22 selects any of the EDC generation block 20, the data memory 18 and the data control unit 16 for each of the data regions of data to be recorded and outputs the acquired data to the encoder 24.

For simplification of description, it is assumed that the amount of user data to be accessed at the time of code generation (at the time of generating the EDC intermediate value) is the same between the recording apparatus 101 according to the reference 2 and the recording apparatus 1 according to the exemplary embodiment as shown in FIGS. 5 and 6. However, in this exemplary embodiment, the data read out at the time of generating the EDC intermediate value is divided into the data of the region A and the data of the region B. Then, in this exemplary embodiment, the data of the region A, among the data read out at the time of generating the EDC intermediate value, is stored into the data memory 18. The data of the region A is diverted to the recording. This eliminates the need to read the data of the region A from the data buffer 10 at the time of recording. Further, the data of the region B which is necessary at the time of generating the EDC intermediate value is read out by accessing the data buffer 10 during the period when the recording process records the ECC (the period when no access is made to the data buffer).

On the other hand, the following two ways are possible as a method of access to the data buffer 110 in the reference 2 as shown in FIG. 9A. One is to divide the data shown in FIG. 5 which is necessary at the time of code generation and access the data buffer 110 equally during the user data recording period and the ECC recording period. Therefore, during the user data recording period, for example, data access of 13 Kbytes is required for the code generation and data access of 64 Kbytes is required for the recording, so that data access of 74 Kbytes in total is required.

The other one is to read data of about 10 Kbytes, which is the same amount of data as the ECC, among data of 15K bytes for code generation during the ECC recording period because access to the data buffer 110 is not made in this period and then make access for the remaining 5 Kbytes during the user data recording period. In this case, for the remaining 5 Kbytes, buffer access for the data recording and buffer access for the code generation occur concurrently.

On the other hand, in this exemplary embodiment, the reading of the region B for the code generation is performed during the ECC recording period when there is no data buffer access in the recording process. Then, the reading of the region A which is further required for the code generation is made from the data buffer 10, which is also performed during the period when there is no access to the data buffer 10 in the recording process. Specifically, in the reading of the region C, because the part corresponding to the region A is stored in the data memory 18, the data corresponding to the region A, among the data of the region C to be read out in the recording process, is read out from the data memory 18. Thus, in the recording process, there is no need to access the data buffer 10 at the time of acquiring the data of the region A. Accordingly, at the time of access of the region A in the code generation, data transfer used for the recording process of the channel 2 is stopped. In this manner, in this exemplary embodiment, access to the data buffer 10 does not operate in parallel (does not occur concurrently) between the code generation and the recording. Therefore, the amount of data recorded during the user data recording period and the data acquired through buffer access for the recording and the code generation are the same, which is 64 Kbytes. In this manner, because access to the data buffer 10 occurs exclusively, buffer access is not concentrated during the user data recording period, thus being compatible with high speed operation.

As described above, although user data to be read from the data buffer during the user data recording period is 77 Kbytes in the reference 2, user data to be read from the data buffer 10 during that period is reduced to 64 Kbytes in this exemplary embodiment. It is thereby possible to solve the issue according to the reference 2 that buffer access cannot be made in time at the time of high speed recording.

Figure 10:
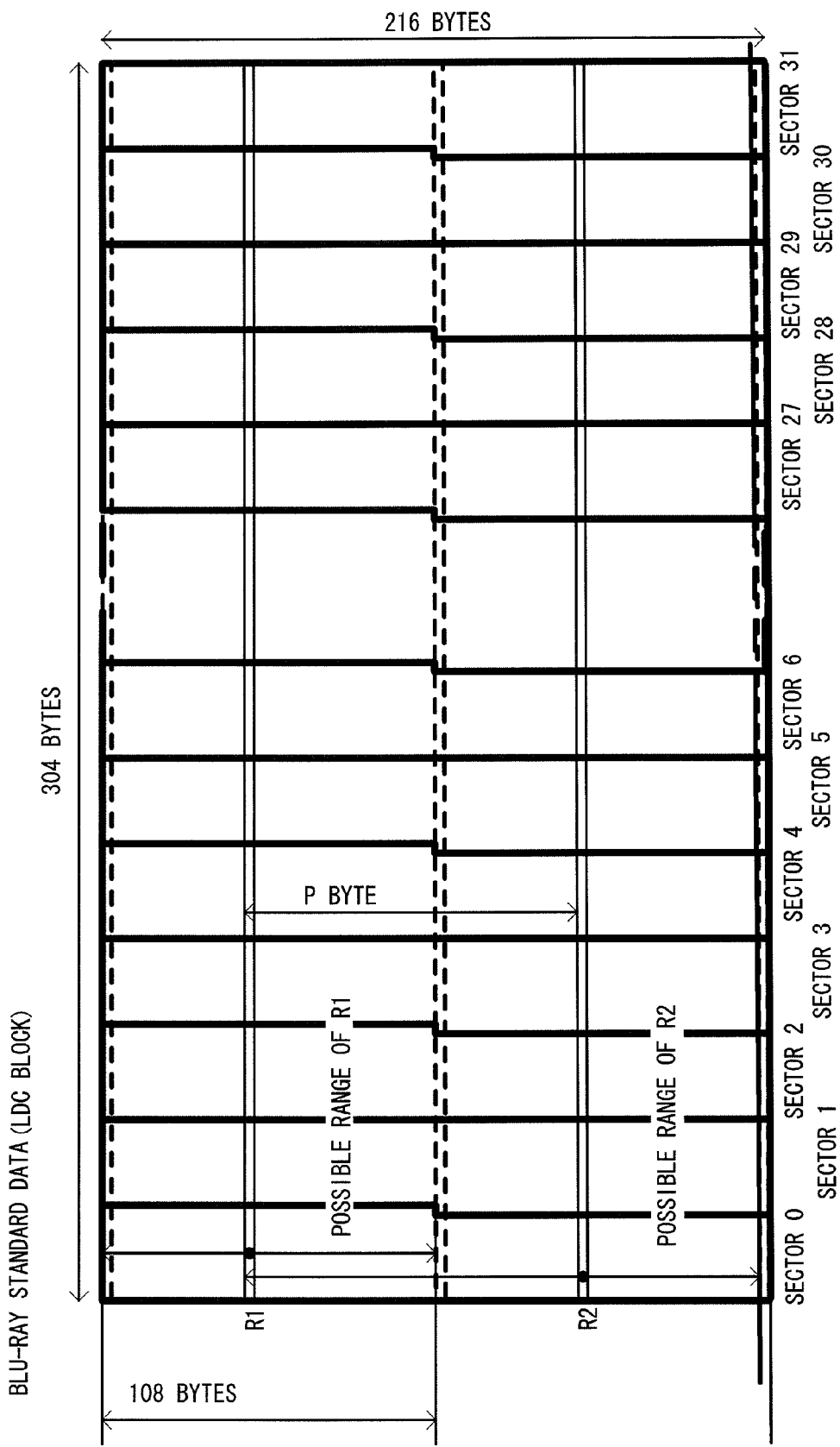
FIG. 10 is a view to illustrate rows R1 and R2 and P bytes.
Figure 11:
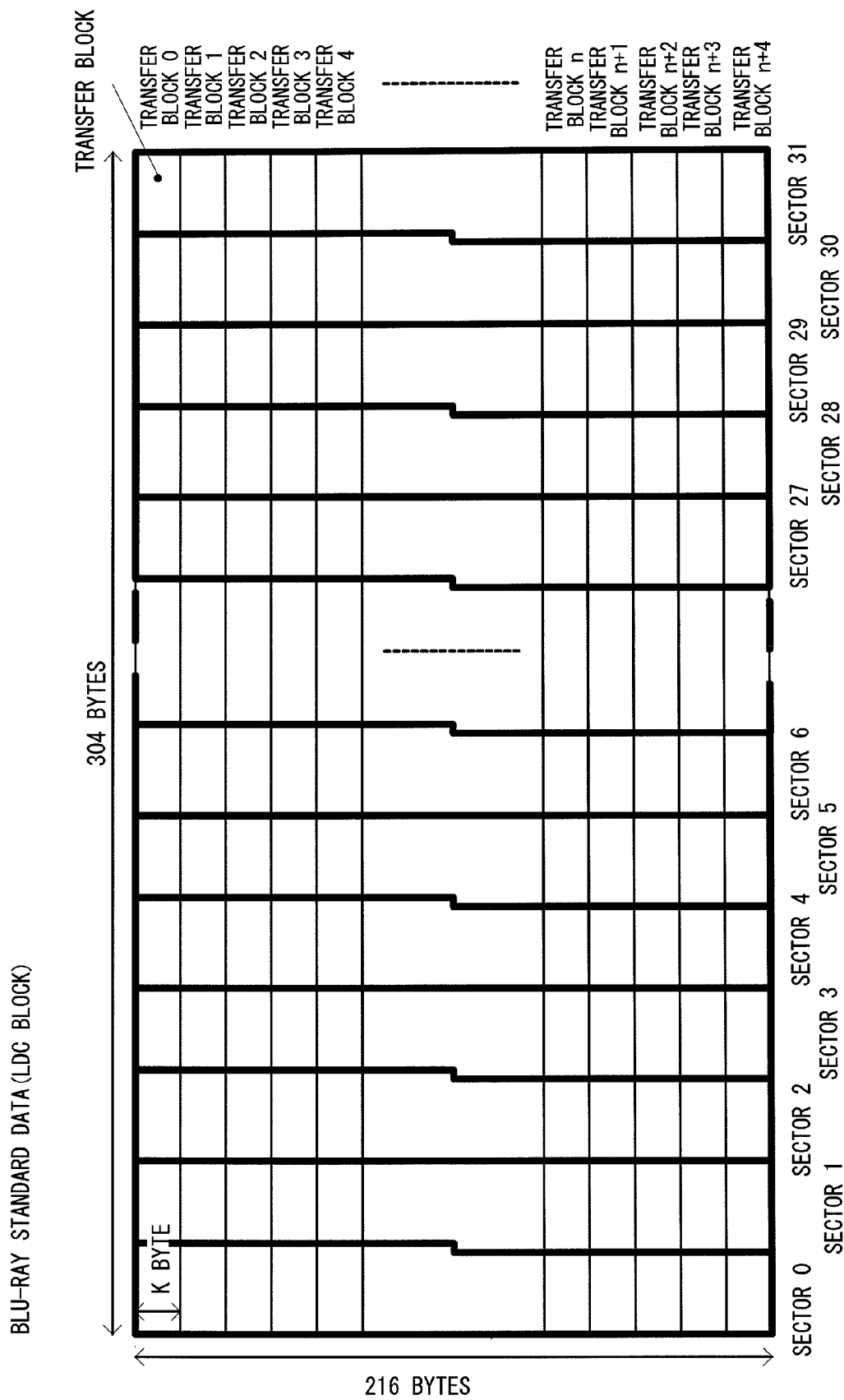
FIG. 11 is a view to illustrate a transfer block.

The exemplary embodiment is described in further detail hereinbelow. Firstly, the definition related to the directionality of data according to the exemplary embodiment is as follows. FIG. 10 is a view to illustrate rows R1 and R2 and P bytes. FIG. 11 is a view to illustrate a transfer block.

[Definition of Rows R1 and R2]

In Blu-ray standard data (LDC block), assume that R1 is a given row from the first row (0th row) to the 108th row (a given row of the total 109 rows from the 0th to 108th rows). R2 is a given row from R1 to the final row. R1 and R2 are apart by P bytes.

Specifically, R1 is any row from the row 0 to the row 108, R2 is any row from the row 0 to the row 215, R1≦R2, and P is an integer from 0 to 215 (0 byte at minimum, 216 bytes at maximum).

[Definition of Transfer Block]

A group of data obtained by dividing the first row to the final row of Blu-ray standard data (LDC block) into smaller blocks of K bytes each is defined as a transfer block. The transfer block is in ascending order in the direction of ascending order of row number. K is an integer from 4 to 216, by which 216 is dividable. The transfer block is a unit of the size of the reordering buffer 28. The reordering buffer 28 is composed of SRAM or the like at least having a capacity corresponding to two transfer blocks. When one transfer block is written, data is read out in the recording frame direction P, which is the data recording sequence, and input to the modulator 30. Because the data sequence is reordered into the recording frame direction P by the reordering buffer 28, the recording processing is performed on the basis of the size of the transfer block in this exemplary embodiment as well.

Figure 12:
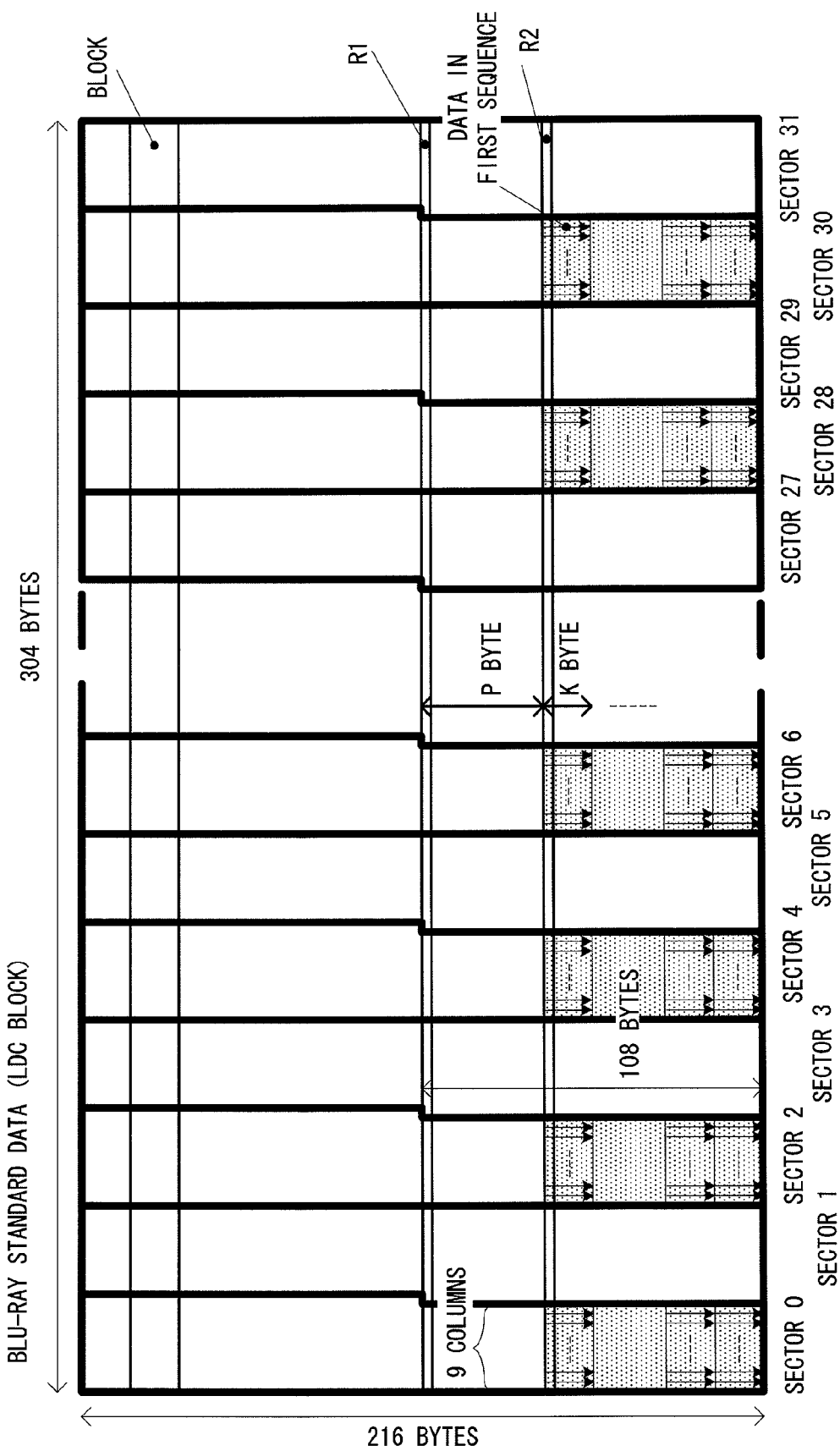
FIG. 12 is a view to illustrate a sequence A of reading data from a data buffer 10 in the first exemplary embodiment of the present invention.
Figure 13:
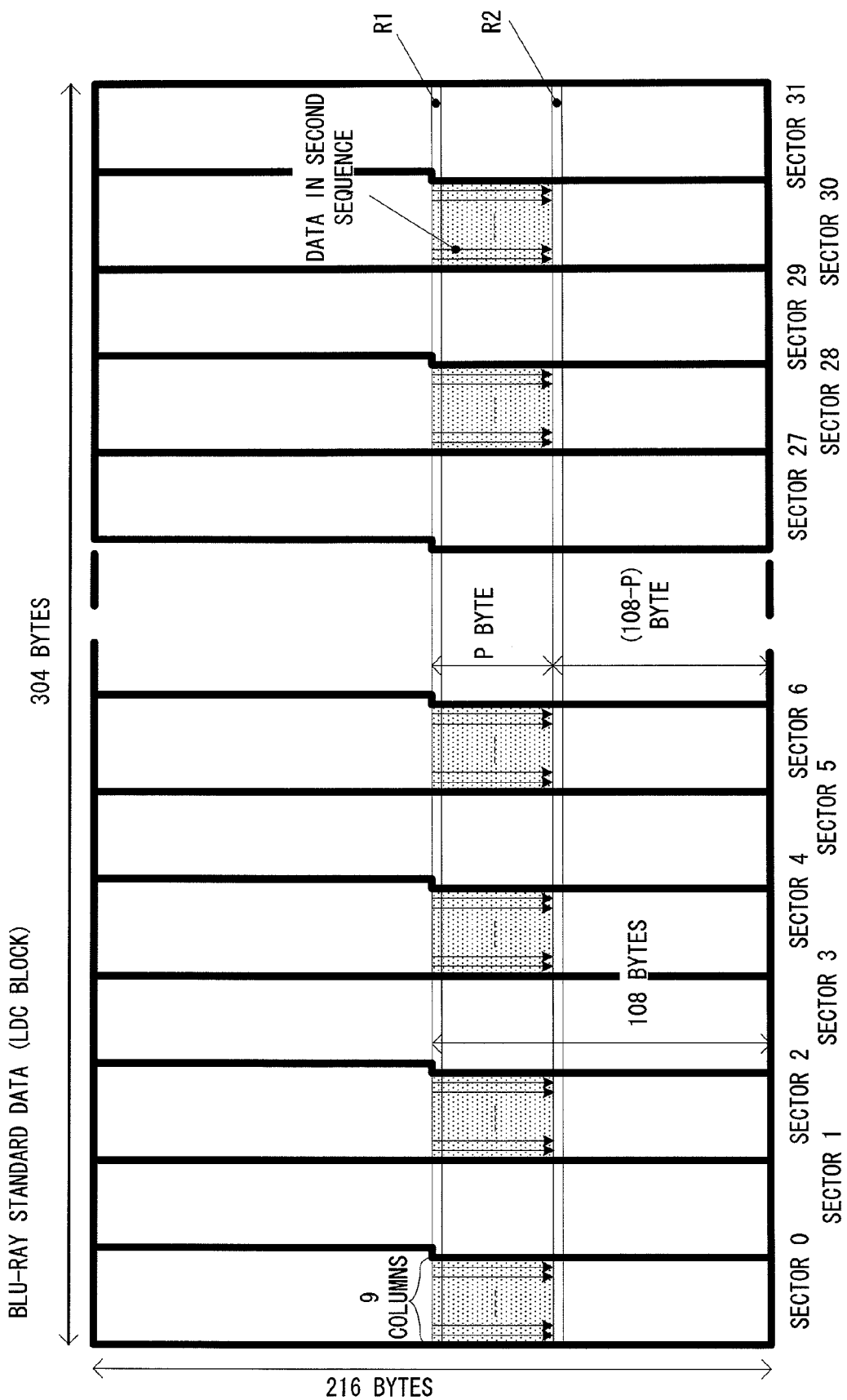
FIG. 13 is a view to illustrate a sequence B of reading data from the data buffer 10 in the first exemplary embodiment of the present invention.
Figure 14:
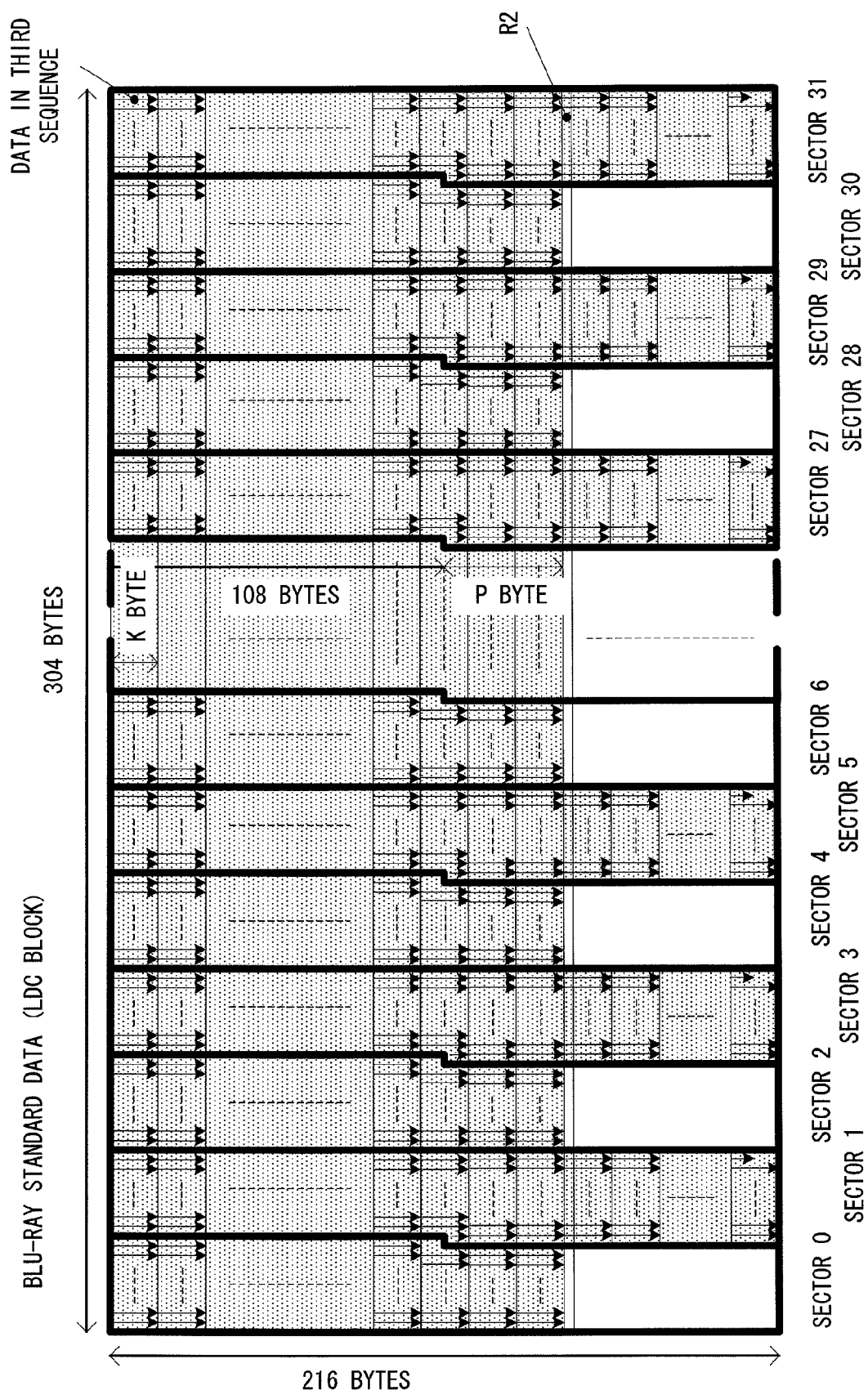
FIG. 14 is a view to illustrate a sequence C of reading data from the data buffer 10 in the first exemplary embodiment of the present invention.

FIGS. 12 to 14 are views to illustrate a sequence A, a sequence B and a sequence C of reading data from the data buffer 10 in the exemplary embodiment.

[Data in Sequence A in Code Generation]

As shown in FIG. 12, in the LDC block, a region which is an even-number sector and from the row R2 to the final row is referred to as a region A. The sequence A is the sequence in ascending order of block number, in ascending order of column number in each block, and in ascending order of row number in each column, and the data in the region A is read out from the data buffer 10 in the sequence A.

[Data in Sequence B in Code Generation]

As shown in FIG. 13, in the LDC block, a region which is an even-number sector and from the row R1 to a row just before the row R2 is referred to as a region B. The sequence B is the sequence in ascending order of column number, and in ascending order of row number in each column, and the data in the region B is read out from the data buffer 10 in the sequence B.

Note that, when R1=R2 as in the case of a second exemplary embodiment described later, data in the region B does not exist, and processing performed by referring to the data in the region B also does not exist. Further, the data in the region B is data which is used only for generating an EDC intermediate value and not necessary to be stored, the sequence is not limited to the sequence B but the same sequence as the sequence A, for example, may be applied.

[Data in Sequence C in Recording]

As shown in FIG. 14, in the LDC block, a region from the head 0th row to a row just before the row R2 is in the sequence is in ascending order of block number, in ascending order of column number in each block, and in ascending order of row number in each column. Further, in a region from the row R2 to the final row in an odd-number sector of the LDC block, the data is read out from the data buffer 10 in the sequence in ascending order of block number, in ascending order of column number in each block, and in ascending order of row number in each column. The sequence is the sequence C, and a region of the user data read out in the sequence C is a region C. The region C is a region where data of the region A is excluded from the LDC block. This is the same sequence as the sequence A.

[Principle of EDC Generation]

A generation method of an EDC is described hereinbelow. In a Blu-ray disc, an EDC of 4 bytes (32 bits) is added to user data of 2048 bytes (16384 bits). The 32-bit EDC can be obtained by dividing a code string D(x) having 2048-byte user data with 4-byte 0 data by the following generating polynomial:

$$G(x)=X^{32}+X^{31}+X^4+1$$

If the 2048-byte user data is I(x), the error detecting code EDC(x) to be added thereto is expressed as follows:

$$EDC(x)=\Sigma b_t * X^t = I(x) \bmod G(x) (\Sigma: t=31 \text{ to } 0)$$

where $I(x)=\Sigma b_t * X^{t \text{ and }} G(x)$ ($\Sigma$:t=16415 to 32)

Consequently, the code string D(x) with the error detecting code EDC(x) added can be expressed as follows:

$$D(x)=I(x)+EDC(x)$$

where the symbol "+" represents the exclusive OR (XOR) operation.

Figure 15:
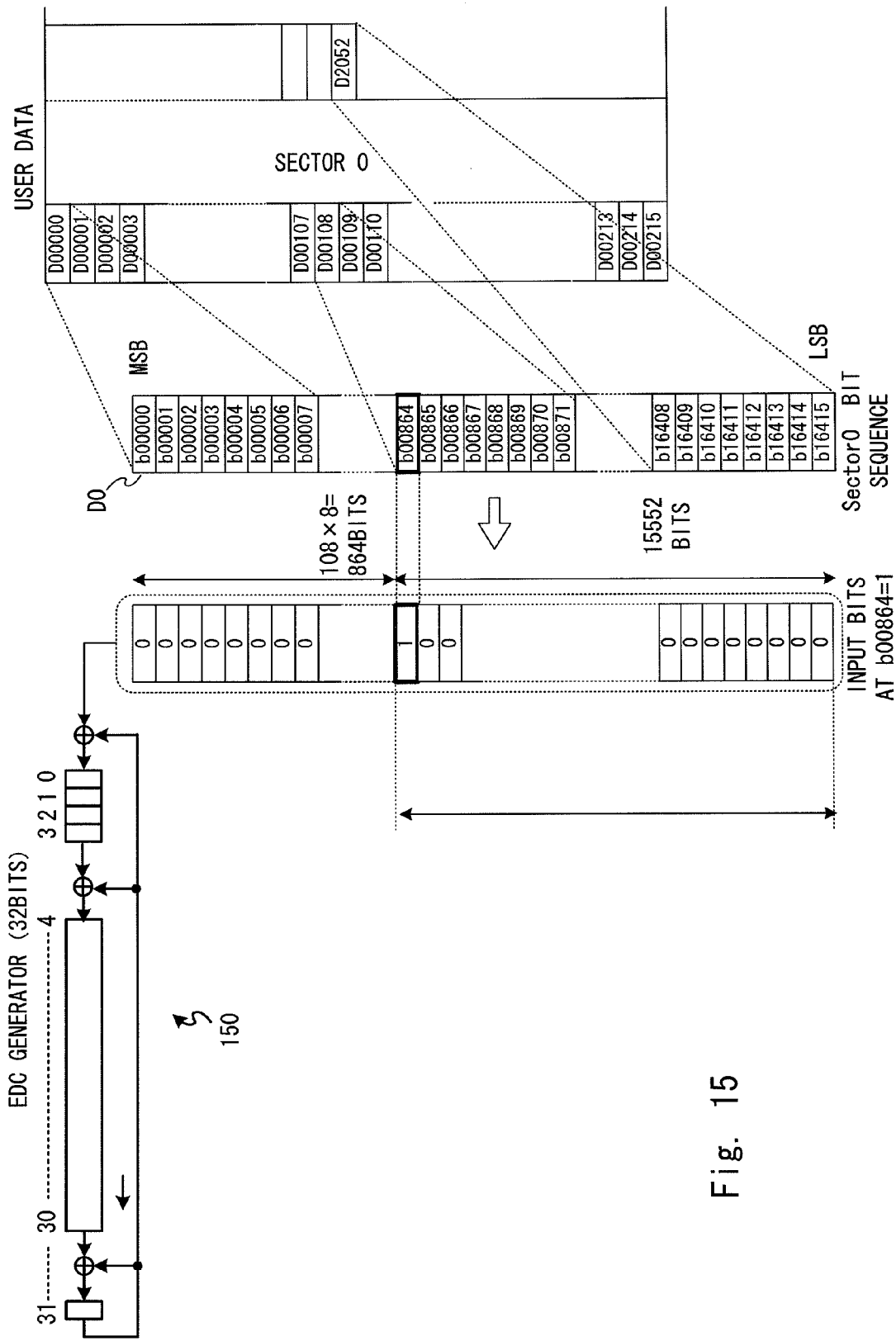
FIG. 15 is a view showing a 32-bit shift register that generates an EDC.

The above-described error detecting code EDC(x) can be obtained by inputting the code string I(x) to the 32-bit shift register shown in FIG. 15. The value of the 32-bit shift register after inputting all codes of the code string I(x) is the error detecting code EDC(x) (=0). In this exemplary embodiment, the bit sequence in the user data direction Q is q, which is expressed as: q=b00000, b00001, . . . , b16415, t=16415−q.

The error detecting code E(x) can be obtained by calculating the XOR of $X^t \bmod G(x)$ which corresponds to the bit with the code "1" in the input code string D(x). $X^t \bmod G(x)$ represents the remainder after dividing the code string d(x) where 0 is set to the bits other than the (16415−q)(=t)th order bit of the code string D(x) with k=16416 bits by G(x).

Figure 16:
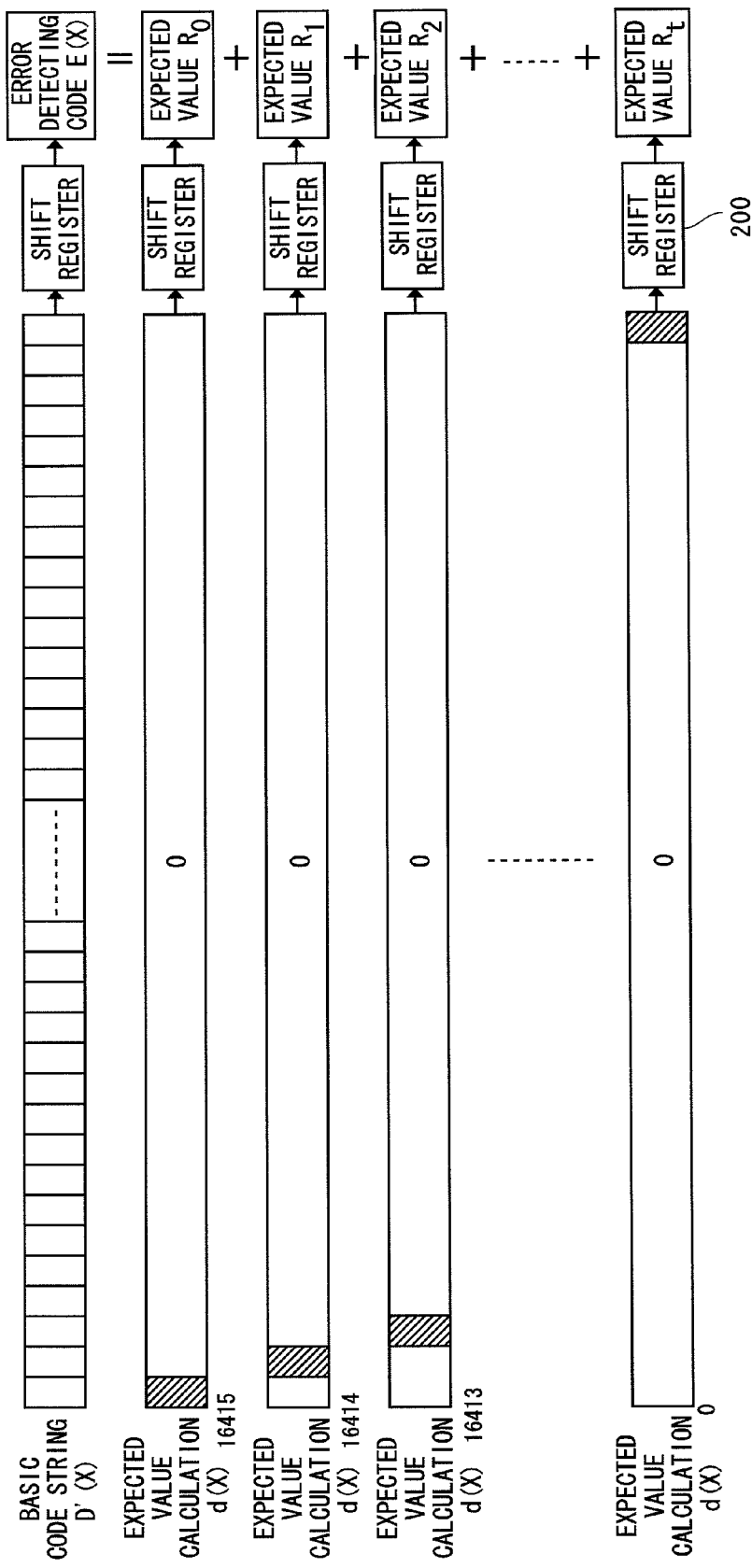
FIG. 16 is a view to illustrate the above-described idea.

FIG. 16 is a view to illustrate the above idea. The code string D(x) of k bits where the bits are all "1" ({111 . . . 1}) is a basic code string D'(x). The 32-bit shift register value which is obtained by inputting the code string D'(x) to the shift register 50 shown in FIG. 15 is an error detecting code E'(x) of the code string D'(x). In this exemplary embodiment, the code string D'(x) contains k=2052×8−16416 bits.

First, the basic code string D'(x) is k-number of code strings $d(x)_t$, which is referred to hereinafter as expected value calculation code strings, as shown in FIG. 16. Specifically, each expected value calculation code string $d(x)_{16415 \text{ to } 0}$ is a code string in which only the bit corresponding to q is "1" and all the other bits are "0". To be precise, q=b00000 corresponds to a code string $d(x)_{16415}=\{100 \ldots 0\}$ in which only the most significant bit is "1", and q=b00001 corresponds to a code string $d(x)_{16414}=\{010 \ldots 0\}$ in which only the second bit is "1". Likewise, q=b16415 corresponds to a code string $d(x)_0=\{000 \ldots 1\}$ in which only the least significant bit is "1". By inputting those expected value calculation code strings $d(x)_t$ to the shift register 50, 32-bit shift register value $X^t \bmod G(x)$ can be obtained.

Thus, the remainder after dividing the expected value calculation code string d(x) by G(x), which is an error detecting value, is $X^t \bmod G(x)$. $X^t \bmod G(x)$ is referred to as the expected value in this specification. The expected value $X^t \bmod G(x)$ indicates a syndrome value when only the bit data corresponding to the bit sequence q of the original code string D(x) is false.

The 32-bit shift register value (error detecting code E'(x)) obtained by inputting the code string D'(x) to the shift register 50 is the XOR of all the 32-bit shift register values (expected values $X^t \bmod G(x)=R_t$) obtained by inputting the respective expected value calculation code strings $d(x)_t$ to the shift register 50. Note that the XOR of the expected value corresponding to each bit of the user data in the region A is referred to as an EDC intermediate value 1, and the all XORs of the expected value corresponding to each bit of the user data in the region A and the region B is referred to as an EDC intermediate value 2. When there is no particular need to identify the data to which the XOR of the expected value corresponding, the XOR of such expected value is referred to simply as an EDC intermediate value. In this exemplary embodiment, the EDC intermediate value 2 is calculated from the regions A and B, the remaining expected value is calculated at the time of recording, the XOR is calculated to thereby obtain the EDC.

Thus, the error detecting code E(x) can be obtained as the all XORs of the expected values $X^t \bmod G(x)$ which corresponds to the bit sequence q with the code "1" in the code string D(x). Therefore, the expected value calculation code string d(x) which contains the bit data of the same number of bits as the code string and in which only the bit corresponding to each bit sequence is "1" and all the other bits are "0" when the same bit sequence as the code string is assigned is prepared. Then, the expected values (syndrome values) obtained by inputting the expected value calculation code string d(x) to the shift register 50 are stored or calculated to the same number as the number of bits of the code string D(x), which is k=16416 in this exemplary embodiment. Provided those conditions, the XOR (=EDC) of all the expected values of the bit with the code "1" out of the respective bits of the input code string D(x) can be obtained using such expected values. There is thus no need to input the code string D(x) to the shift register 50. Specifically, if the expected value corresponding to each bit of the code string is known, the error detecting code E(x) of the code string D(x) can be calculated even when the operation is made in a different sequence from the user data direction Q.

The data is processed in units of data block. The data block has 32 sectors (code strings D(x)), and the error detecting value E(x) is calculated for each of the code strings D(x). Thus, 32 error detecting values E(x) are obtained from one data block.

The expected value is described in detail hereinbelow. As shown in FIG. 15, the code string D(x) which is input to the shift register 50 is D(x)=X, in which only the data input to the most significant bit (q=b00864) of the 109th byte (Q=D00108) in the sequence of the user data direction Q is "1" and the data in the others are all "0", for example. Thus, the code string X is such that only the 15552th order data, among 16416 bits, is "1" ($B_{00864}=1$) and the other values are all "0".

In this case, a result of inputting the code string X into the 32-bit shift register 50 is obtained by initializing the value of the shift register 50 to "00000001h" and shifting this value 15552 times.

In order to calculate the EDC, it is only necessary to calculate the XOR of $X^t \bmod G(x)$ where the bit data constituting the code string is "1". If the XOR of $X^t \bmod G(x)$ is obtained, the error detecting value E(x), which is the 32-bit shift register value of the code string D(x), can be obtained.

Figure 17:
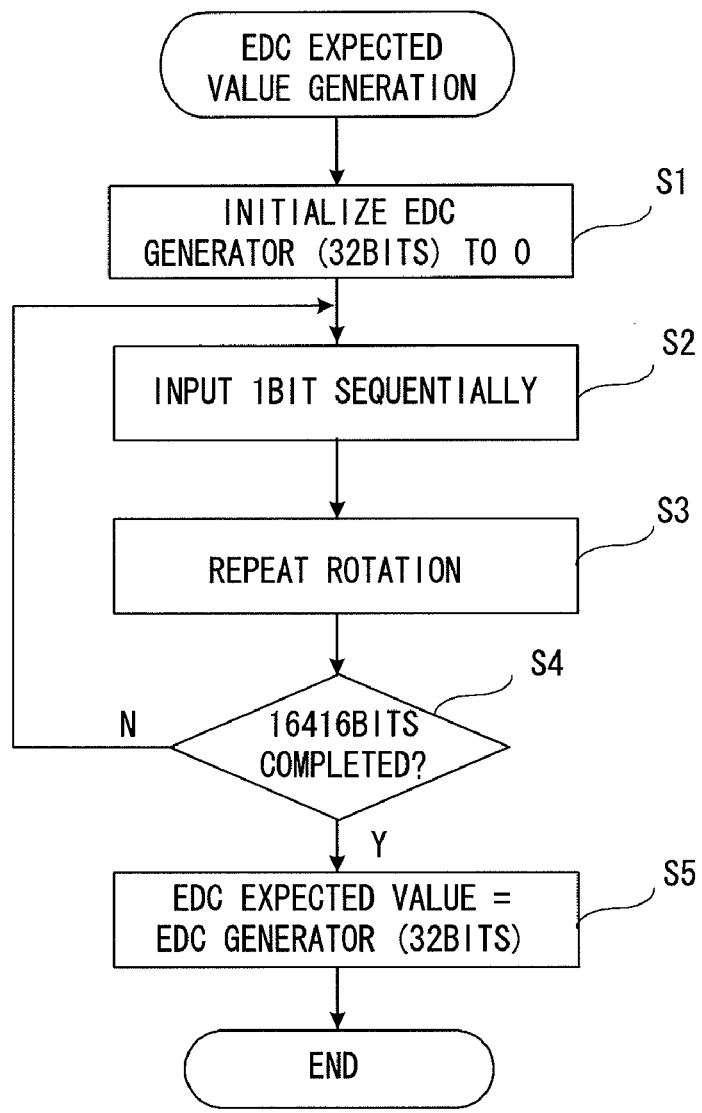
FIG. 17 is a flowchart showing an expected value generation method.

FIG. 17 is a flowchart showing a generation process of an expected value. As shown in FIG. 17, the process first initializes the shift register 50 to 0 (Step S1). The process then prepares the expected value calculation code string d(x) of 16415 bits and inputs the code string d(x) to the shift register 50. The rotation of the shift register 50 is repeated for 16416 bits (Steps S3 and S4), and then the 32-bit register value reaches becomes desired expected values (32 bits) (Step S5).

Incidentally, although an EDC can be calculated in any case if all of the expected values corresponding to the respective bit data are stored, it is not practical to store the same number of expected values as the user data. Thus, in order to minimize the amount of data to be stored, the total 19 expected values corresponding to Row=0 in the area Area0 composed of the sectors 0 and 1 are taken into consideration. In a Blu-ray disc, the data block has a structure having regularity in which 16 data sets, each set having a pair of sectors 0 and 1 (a data set made up of 19 columns), when viewed in the sequence of the user data direction Q. Thus, all areas have the same bit sequence in the user data direction Q. Therefore, it is logically possible to easily calculate all expected values from the 19 expected value calculation code strings in which only MSB is "1" and the others are "0" at Row=0. In this exemplary embodiment, the 19 expected values are referred to as initial expected values. Further, a column number in the area composed of the even-number sector and the odd-number sector is M ($0 \leq M \leq 18$).

Figure 18:
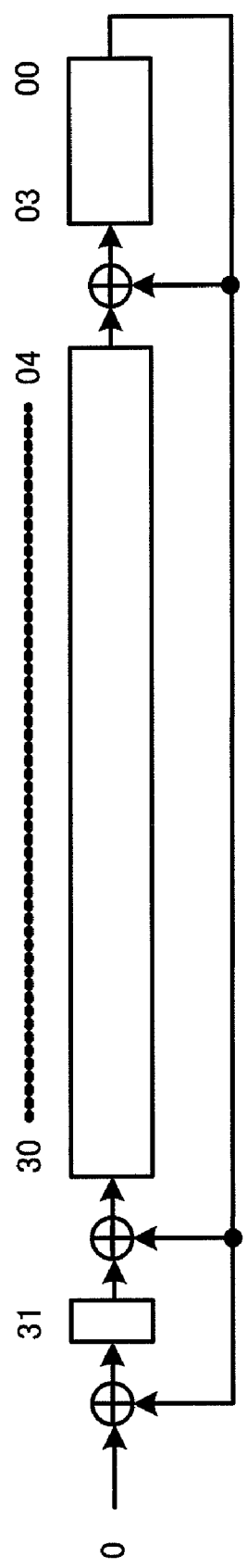
FIG. 18 is a view showing an expected value update rotation circuit.

Thus, the expected values corresponding to the respective bits of the user data in the same user data direction Q (1 to 2048) are the same. The EDC is all XORs of only the expected values where the user data is "1". Note that, although 16 areas each composed of two sectors are included in the LCD block, the expected value for the bit at the same position in each area is the same. FIG. 18 is a view showing an expected value update circuit. The first one bit in ascending order of row number in each area corresponds to the above-described initial expected value. The next expected value is a value obtained by shifting the initial expected value by one bit in the expected value update circuit. Thus, by setting the initial expected value to the register (expected value update circuit) and inputting 0 by one bit, the expected value corresponding to the next bit is obtained. In the case of calculating expected values in the sequence within the area, it is only necessary to sequentially input 0 to the expected value update circuit and shift the value.

Figure 19:
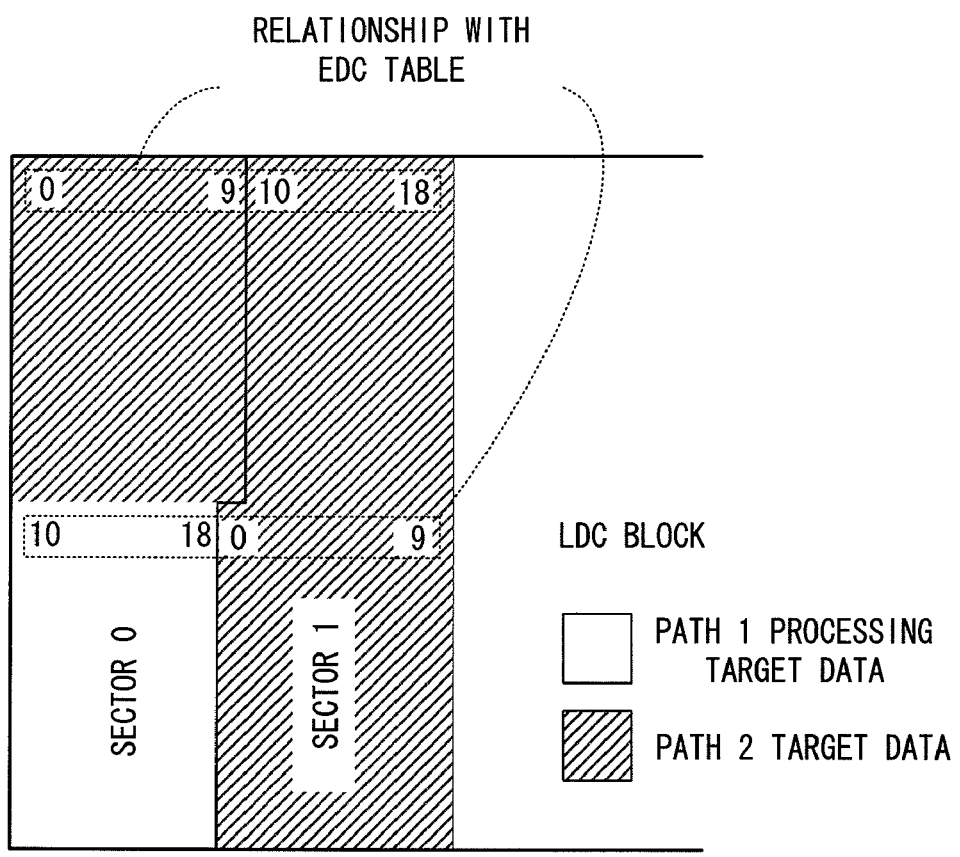
FIG. 19 is a view showing a relationship between user data and an initial expected value.
Figure 20:
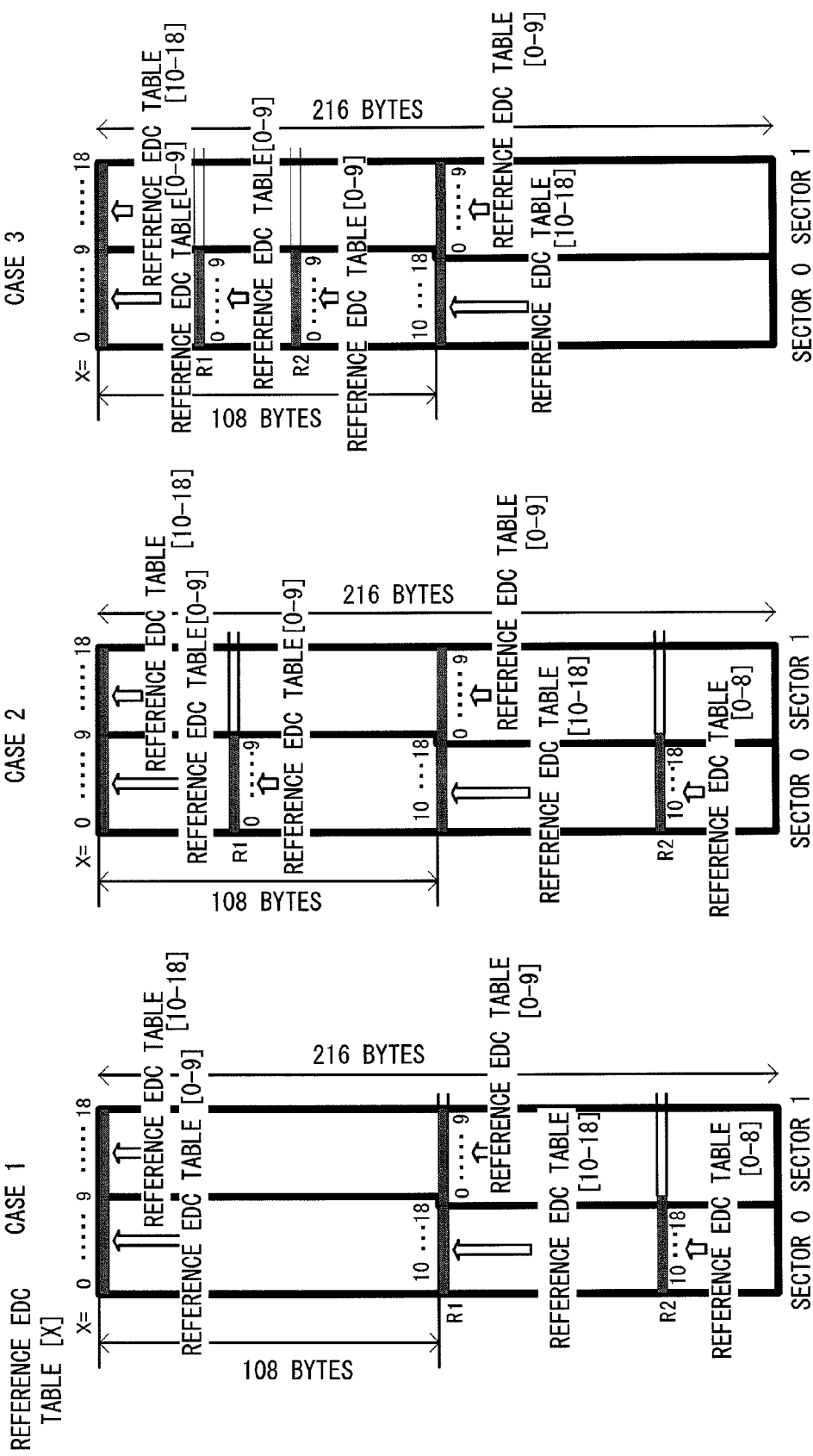
FIGS. 20A, 20B, and 20C are views to illustrate cases 1 to 3, respectively.

Further, the user data in the columns 0 to 18 at Row=108 coincide with the columns 10 to 18 and the columns 0 to 9 at Row=0 when viewed in the user data direction Q. FIG. 19 is a view showing a relationship between the user data and the initial expected value. As shown therein, the above-described initial expected value can be used also when calculating the expected value from Row=108. When, on the other hand, calculating the expected value from another row, an EDC expected value table in which the expected value for the most significant bit of the relevant row is recorded in advance is required. In this exemplary embodiment, it is classified into three cases depending on the position of R1 and R2. FIGS. 20A, 20B, and 20C are views to illustrate cases 1 to 3, respectively. Note that, although the case of R1<R2 is described in the following case 1, it may be R1=R2. In this case, the number of EDC expected value tables can be reduced by one.

[Case 1]

The case 1 is where R1 is the 108th row and R2 is the 109th or subsequent row as shown in FIG. 20A. Specifically, the region A starts at R1=108 and ends at a row just before R2. Thus, the initial expected value can be used for reading of the region B as described above. When R2=152, for example, 19 expected values are obtained from 19 expected value calculation code strings where only the MSB is "1" and the others are "0" at Row=152. Note that the initial expected value at R=152 calculated in advance may be stored, or the initial expected value at R=152 may be calculated from the initial expected value at R=108. Thus, in the initial EDC expected value table which is transmitted to the EDC generation block 20 from the data control unit 16, previously calculated values may be stored for the values other than the value at the row 0, or values may be calculated by updating from the value at the row 0. FIG. 21 is a view showing expected values at Row=0, 152 (the EDC expected value table 1 at Row=0 and the EDC expected value table 2 at Row=152). Note that, because data in the region C is read from Row=0, the EDC expected value table 1 (the initial EDC expected value table) can be used.

[Case 2]

The case 2 is where R1 and R2 both do not match Row=0, 108. This is the case where 0<R1<108 and 108<R2<215. Thus, the region A and the region B both start at a given row different from 0 or 108, and therefore 19 sets of expected values corresponding to the first bit of the region A and the region B are respectively required. Therefore, the EDC expected value table is required for each of the three regions.

[Case 3]

The case 3 is where R1 and R2 both are not Row=0, 108, and they satisfy 0<R1, R2<108 and R1≠R2. In this case also, because the EDC expected value table is required for the region A and the region B, three EDC expected value tables are required.

In this manner, because R1 and R2 are given rows, the EDC expected value table for the relevant row is generally required for each of the regions, that is, three EDC expected value tables are required. However, because the EDC expected value table 1 for the row of R1 can be reused in the case 1, it is only necessary to prepare the EDC expected value table 1 and the EDC expected value table 2. Note that R1 and R2 are not always located at the head of each transfer block and may be located at any row.

Figure 22:
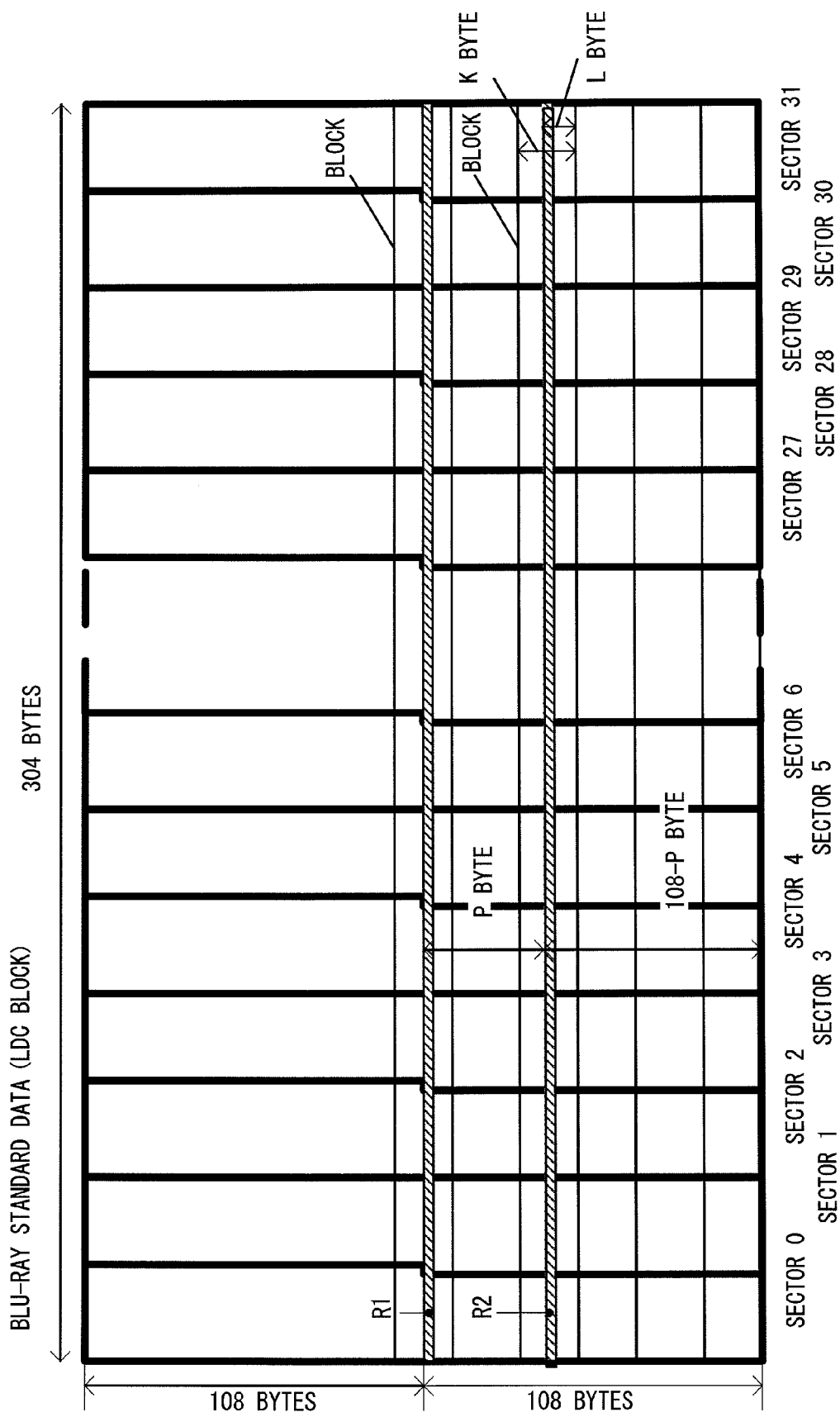
FIG. 22 is a view to illustrate R1 and R2 in the case 1.

The exemplary embodiment is described hereinafter about the case 1. Specifically, the case where R1=108 and R2=152 is described. Note that R1=108 is when the amount of data (the region A and the region B) to be read out in the code generation is the smallest. For the region A, the data is recorded in the data memory 18 for reuse in the recording process. Thus, the data memory 18 is composed of SRAM. If the data memory 18 is composed of SDRAM and burst transfer is applied, high speed recording is enabled. FIG. 22 is a view to illustrate R1 and R2 in the case 1. In the following exemplary embodiment, R2 is in the middle of the transfer block; specifically, the K-th byte from the head byte is R2, and L bytes exist from R2 to the final byte of the transfer block.

[Operation of Recording Apparatus]

Figure 23:
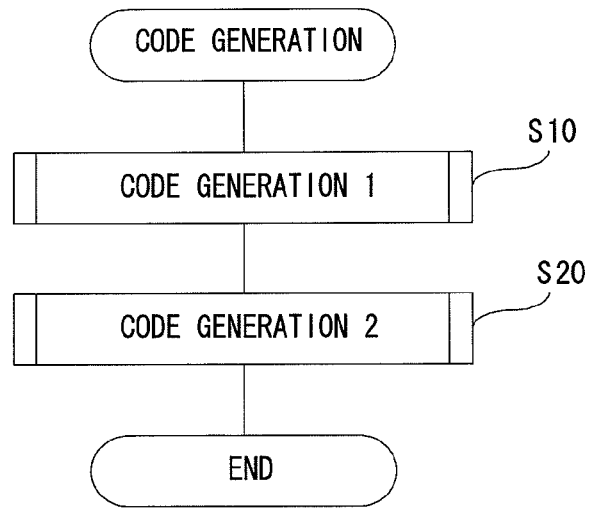
FIG. 23 is a flowchart showing code generation according to an exemplary embodiment of the present invention.
Figure 24:
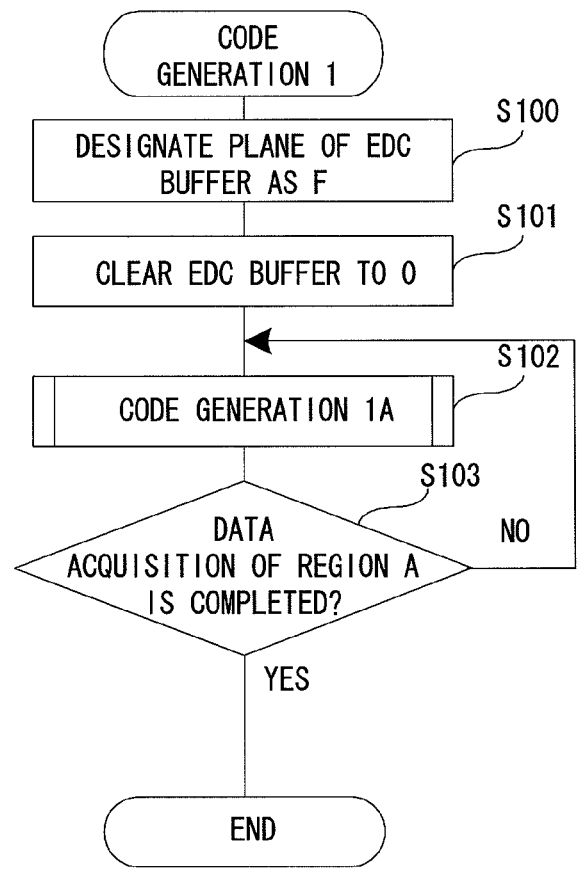
FIG. 24 is a flowchart showing a process of code generation 1.
Figure 25:
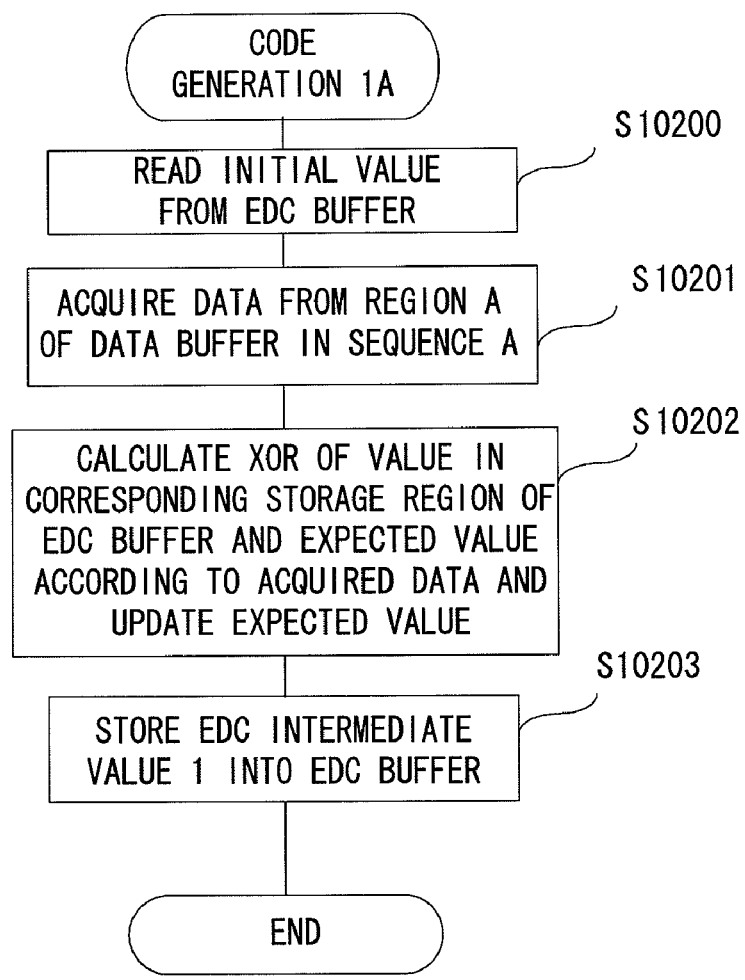
FIG. 25 is a flowchart showing a process of code generation 1A.

An operation of the recording apparatus according to the exemplary embodiment is described hereinbelow. FIG. 23 is a flowchart showing code generation according to the exemplary embodiment, FIG. 24 is a flowchart showing a process of code generation 1, and FIG. 25 is a flowchart showing a process of code generation 1A.

In the recording apparatus according to the exemplary embodiment, code generation and recording are executed in parallel. Specifically, while the recording of a cluster N is performed, the code generation of a cluster N+1 is performed.

[Operation of Code Generation]

In the code generation, after a process of generating an EDC intermediate value 1 (which is referred to hereinafter as code generation 1) is executed, a process of generating an EDC intermediate value 2 (hereinafter as code generation 2) is executed. It is assumed that an EDC buffer 211 has at least two planes, F and J, of memory area.

In the code generation 1, an EDC buffer plane is designated as F (Step S100) and then initialized (cleared to 0) (Step S101). After that, a process of generating an EDC intermediate value 1 from user data of the region A (code generation 1A process) is executed on the user data of the region A of the data buffer 10 (Step S102, S103).

In the code generation 1A, a value (initially, a code with all 0) is read out from the storage area of the EDC buffer 211 corresponding the current sector (Step S10200). On the other hand, the data control unit 16 acquires data from the region A of the data buffer 10 in the sequence A (S10201). Then, the data control unit 16 updates the EDC intermediate value by calculating the XOR of the value in the corresponding storage area of the EDC buffer and the expected value according to the acquired data, and further updates the expected value (S10202). At the time when all of the user data in the region A are input, the EDC intermediate value 1 is obtained, and the data control unit 16 stores the obtained EDC intermediate value 1 into the storage area of the EDC buffer 211 corresponding the current sector (S10203).

A specific process of the code generation 1A is as follows. First, the data control unit 16 confirms that there is a free space in the data memory 18. After confirmation, the data control unit 16 acquires the data in the region A of the cluster N in the sequence A from the data buffer 10 through the channel 2 (14). The data control unit 16 sends the acquired data to the EDC generation block 20 and also stores the data into the free space in the data memory 18. The EDC generation block 20 calculates expected values corresponding to the respective bit sequences q of the data in the region A of the cluster N obtained from the data control unit 16, calculates the XOR of the respective expected values, and finally obtains the EDC intermediate value 1.

Figure 26:
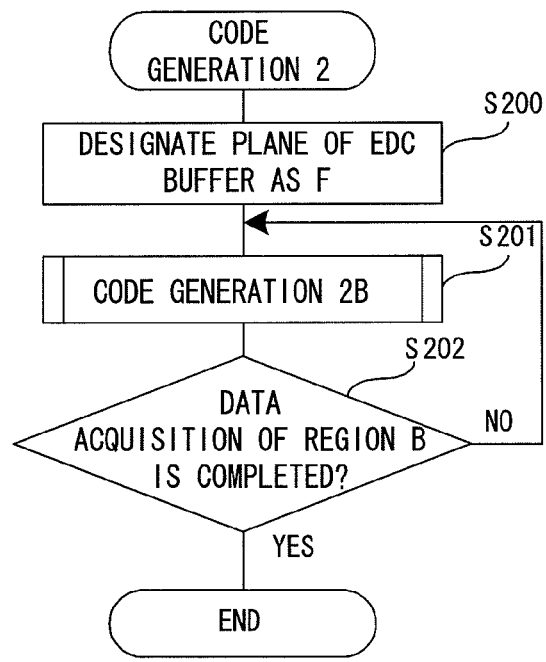
FIG. 26 is a flowchart showing a process of code generation 2.
Figure 27:
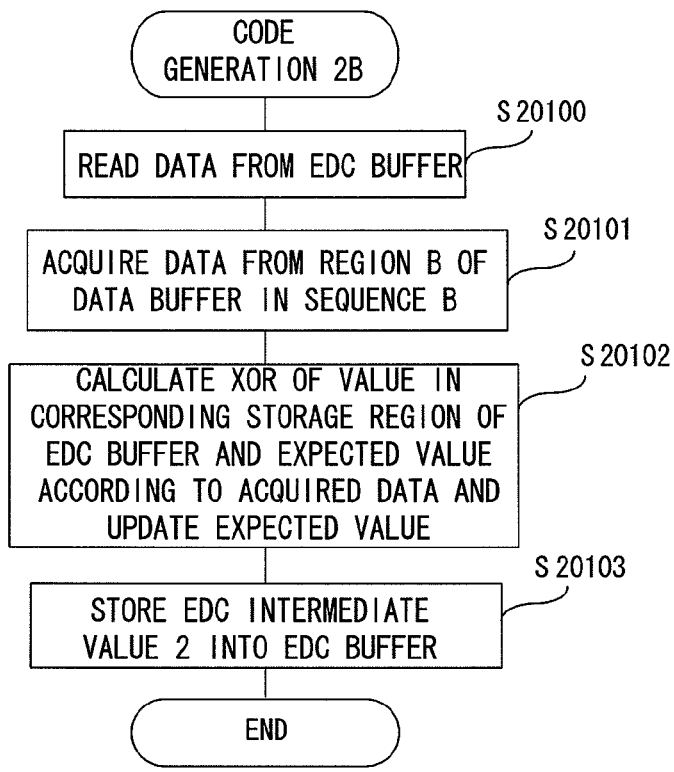
FIG. 27 is a flowchart showing a process of code generation 2B.

FIG. 26 is a flowchart showing a process of code generation 2, and FIG. 27 is a flowchart showing a process of code generation 2B. As shown in FIG. 26, in the code generation 2, a plane of the EDC buffer 211 is designated as F (Step S200), and then a process that the EDC generation block 20 generates an EDC intermediate value 2 from user data of the region B (code generation 2B process) (Step S201) is executed on all the user data of the region B of the data buffer 10 (Step S202).

As shown in FIG. 27, in the code generation 2B, a value (initially, the EDC intermediate value 1) is acquired from the storage area of the EDC buffer 211 corresponding the current sector (Step S20100). On the other hand, the data control unit 16 acquires data of one sector from the region B of the data buffer 10 in the sequence B (S20101). Then, the data control unit 16 updates the EDC intermediate value by calculating the XOR of the EDC intermediate value stored in the corresponding storage area of the EDC buffer and the expected value according to the acquired data, and further updates the expected value (S20102). At the time when all of the user data in the region B are input, the EDC intermediate value 2 is obtained, and the data control unit 16 stores the obtained EDC intermediate value 2 into the storage area of the EDC buffer 211 corresponding the current sector (S20103).

A specific process of the code generation 2B is as follows. After completing the acquisition of the user data corresponding to the region A, the data control unit 16 acquires the data in the region B of the cluster N in the sequence B from the data buffer 10 through the channel 1 (12) and sends the acquired data to the EDC generation block 20. Note that the user data of the region B is not stored and used only for the generation of the EDC intermediate value 2. The EDC generation block 20 sequentially calculates the XOR of the EDC intermediate value 1 and the expected value corresponding to each bit of the data in the region B of the cluster N. Finally, the EDC intermediate value 2 is obtained from all the data in the region A and the region B. Note that the EDC intermediate value 2 is an EDC intermediate value in the reference 2. The code generation thereby ends. The recording apparatus simultaneously performs the above-described code generation and the following recording process in parallel operation.

[Operation of Recording Process]

Figure 28A:
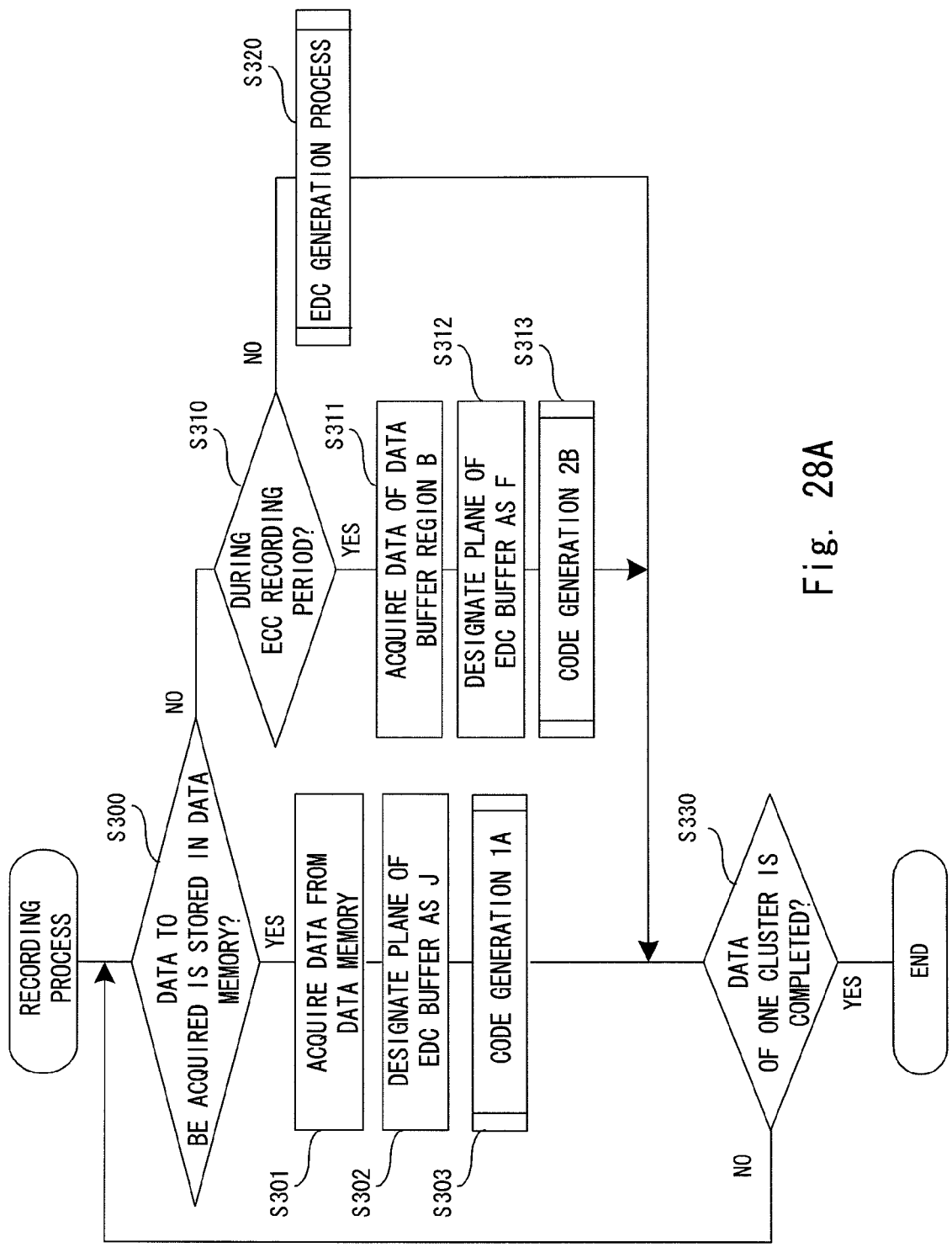
FIG. 28A is a flowchart showing a recording process.
Figure 28B:
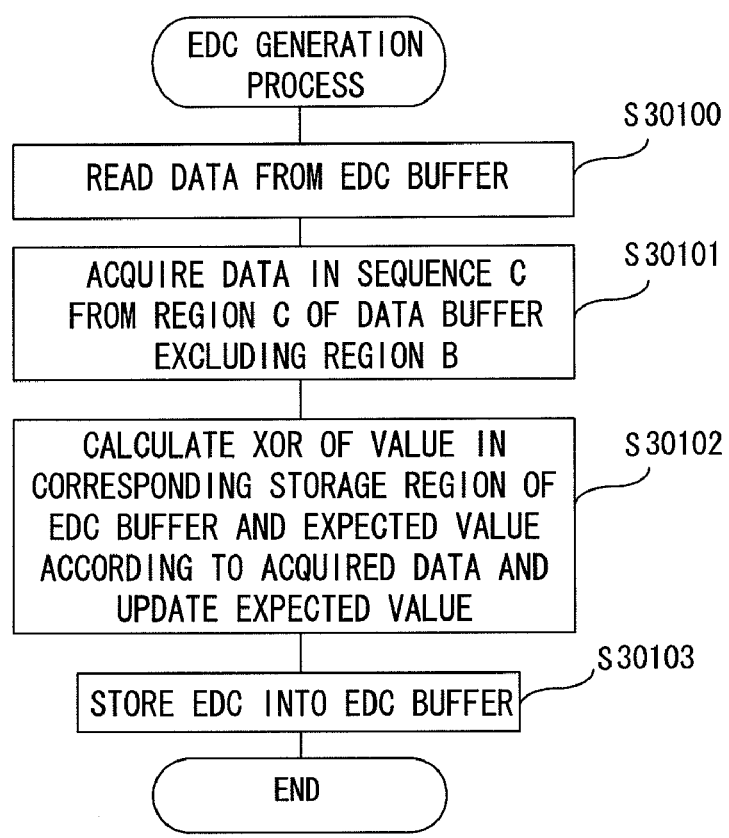
FIG. 28B is a flowchart showing an EDC generation process.

FIG. 28A is a flowchart sowing a recording process. FIG. 28B is a flowchart showing an EDC generation process. As shown in FIG. 28, in the recording process, the data in the region C is acquired from the data buffer 10 in the sequence C, and the data in the region A is acquired from the data memory 18 in the sequence A. Thus, it is determined whether the user data to be acquired is stored in the data buffer 10 or in the data memory 18 (Step S300). When the data to be acquired is stored in the data memory 18 (Step S300), the data of one sector in the region A is acquired from the data memory 18 (Step S301). At this time, the EDC buffer plane is designated as J (Step S302), and the code generation 1A is executed at the same time (Step S303). The code generation 1A is for performing the code generation of the next cluster.

On the other hand, when the data to be acquired is ECC data (No in Step S300), it is determined to be during the ECC recording period. When it is during the ECC recording period (Yes in Step S310), the data in the region B is acquired from the data buffer 10 in the sequence B, and sent to the EDC generation block 20 for generating the EDC intermediate value 2 (Step S311). Then, the EDC buffer plane is designated as F (Step S312), and the code generation 2B is executed (Step S313). The EDC generation process in this step is for sequentially updating the EDC intermediate value and generating the EDC.

When it is not during the ECC recording period (No in Step S310), the read data is sent to the EDC generation block 20, and the EDC generation process is executed (Step S320). The code generation in this step is for correcting the EDC intermediate value 2 and generating the EDC. Specifically, as shown in FIG. 28B, data is read out from the EDC buffer (Step S30100), and the data in the sequence C is acquired from the region C of the data buffer, excluding the region B (Step S30101). Then, the EDC intermediate value is updated by calculating the XOR of the value in the corresponding storage area of the EDC buffer and the expected value according to the acquired data, and further the expected value is updated (Step S30102). At the time when the XOR operation of all data ends, the EDC is obtained from the EDC intermediate value. The obtained EDC is stored into the EDC buffer (Step S30103).

A specific operation of the recording process is as follows. The data control unit 16 acquires the data in the region C of the cluster N in the sequence C from the data buffer 10 through the channel 2 (14) as data to be used for the recording process, and transfers the acquired data to the EDC generation block 20 and the integration unit 22. The EDC generation block 20 generates the EDC from the previously generated EDC intermediate value 2 and the data in the sequence C in the region C of the cluster N. Specifically, for the EDC intermediate value 2, the expected value corresponding to each bit of the user data on which the XOR operation with the expected value is not yet performed is calculated, and the XOR with the EDC intermediate value 2 is calculated. The expected value for which the XOR is not yet calculated is an expected value corresponding to each bit of the user data in a region where the region B is excluded from the region C.

When the user data to be recorded corresponds to the data stored in the data memory 18, that is, when it is the data corresponding to the region A, the integration unit 22 acquires the user data from the data memory 18. When the user data does not correspond thereto, that is, when it is the data corresponding to the region C, the integration unit 22 acquires the user data from the data buffer 10. Further, when the data corresponds to the EDC, the integration unit 22 acquires the data from the EDC buffer of the EDC generation block 20 and outputs it to the encoder 24.

Next, while the integration unit 22 acquires the data to be used for the recording process from the data memory 18, the data control unit 16 confirms that there is a free space in the data memory 18 and then acquires the data in the region A of the cluster N+1 in the sequence A from the data buffer 10 through the channel 2 (14). The data control unit 16 then sends the acquired data to the EDC generation block 20 and also stores the data into the free space in the data memory 18. The EDC generation block 20 generates the EDC intermediate value 1 from the data in the region A of the cluster N+1 obtained from the data control unit 16.

Then, when it reaches the ECC recording period, the data control unit 16 acquires the data in the region B of the cluster N+1 in the sequence B from the data buffer 10 through the channel 1 (12) and sends the acquired data to the EDC generation block 20. The EDC generation block 20 calculates the expected value corresponding to each bit of the data in the region B of the cluster N+1 and then generates the EDC intermediate value 2 from the XOR of those expected values and the EDC intermediate value 1.

Note that data of one cluster of Blu-ray is 64 Kbytes, which is 10000h bytes in hexadecimal number. It is assumed that 10000h bytes as a region on the data buffer 10 is treated as data in one pointer. It is also assumed that access can be made to the data in one pointer by an offset address with respect to each single byte.

In this exemplary embodiment, the user data acquired during the generation of the EDC intermediate value 1 is stored in the data memory 18, and the stored data is reused in the recording process, and therefore a period in which buffer access for user data acquisition is not made to the data buffer 10 exists during the period of the recording process. In this exemplary embodiment, generation of the EDC intermediate value 1 of the next cluster is performed during this period. At this time, because the offset address of target data on the data buffer 10 to be accessed for the generation of the EDC intermediate value 1 is always the same, the channel 2 (14) can perform the address generation in a unified way simply by changing the pointer value in turn.

[Configuration of EDC Generation Block]

Figure 29:
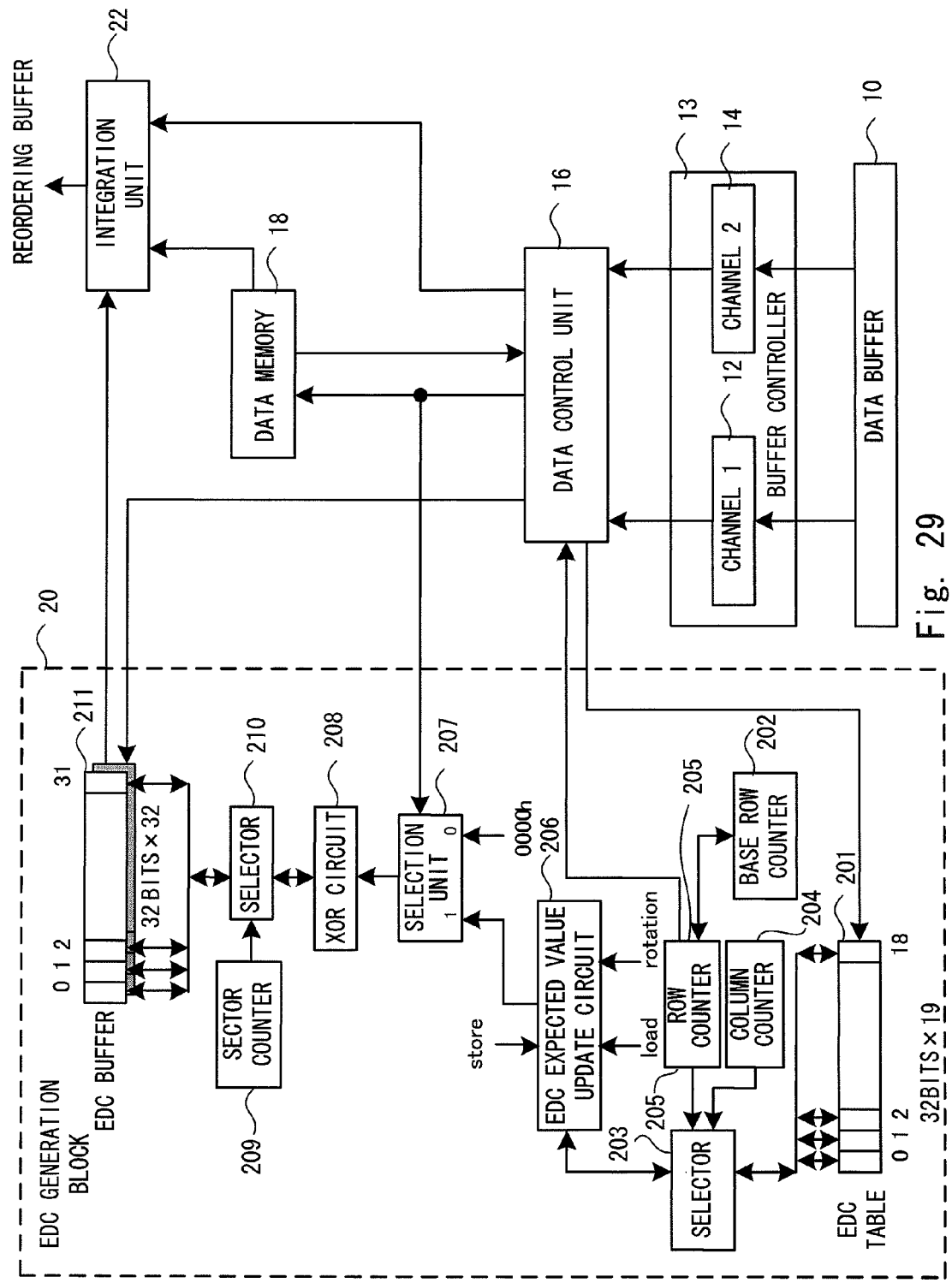
FIG. 29 is a view showing an EDC generation block 20 and a peripheral circuit thereof.

A configuration of the EDC generation block 20 is described hereinafter in detail. FIG. 29 is a view showing the EDC generation block 20 and its peripheral circuit. The EDC generation block 20 includes an EDC buffer 211 that stores EDC intermediate values 1, 2 and so on and an EDC table 201. Further, the EDC generation block 20 includes a base row counter 202, a row counter 205, a column counter 204, selectors 203 and 210, an expected value update rotation circuit 206 (cf. FIG. 24), a selection unit 207, an XOR circuit 208, and a sector counter 209.

The EDC table 201 is the EDC expected value table 1, or 2 shown in FIG. 21 or a table created by reading the data from the EDC expected value table 1, or 2. Hereinafter, values stored in the EDC table 201 are referred to as initial expected values.

The base row counter 202 counts rows in units of transfer block. If the column width of the transfer block is eight bytes, the base row counter 202 counts like 0→8→16→ . . . and so on. The row counter 205 counts rows in the transfer block. If the transfer block has the column width of 8 bytes as described above, the row counter 205 counts from 0 to 7 and, when counting next, reads the count value of the base row counter 202. While the count value is eight bytes, because the row counter 205 reads the value from the base row counter 202 each time, the count value is 0 to 215. The column counter 204 counts a column number of the transfer block (LDC block).

The expected value update rotation circuit 206 basically has the same configuration as the EDC generator as shown in FIG. 18. As shown in FIG. 18, the expected value update rotation circuit 206 has a configuration in which the 32-bit shift register is rotated. When the 32-bit initial expected value in the column corresponding to the user data supplied from the data control unit 16 is input by the selection unit 207, the expected value update rotation circuit 206 sequentially shifts the expected value so that it becomes the expected value corresponding to the bit sequence q in the user data direction Q and rotates them.

The initial expected value is an expected value corresponding to the most significant bit with the row number Row=0, and the initial expected value corresponding to the most significant bit with the row number Row=0 is a value obtained by adding +10 to the column number M with the row number Row=0. Thus, as the expected value corresponding to the user data at Row=108, the initial expected value corresponding to the column number in which +10 is added to the count value of the column counter 204 is read from the selector 203 and supplied to the expected value update rotation circuit 206.

The EDC intermediate value is obtained as the XOR of the expected value corresponding to the bit with the user data of "1", and the selection unit 207 outputs the expected value corresponding to the bit sequence q of the user data, which is generated by the expected value update rotation circuit 206, only when the user data input from the data control unit 16 is "1". Further, when the user data is "0", the selection unit 207 selects and outputs "00000000h".

The XOR circuit 208 reads the EDC intermediate value stored in the EDC buffer 211 which is selected by the selector 210 according to the count value of the sector counter 209, calculates the XOR with the output from the selector 210, and writes the obtained value back to the EDC buffer 211 through the selector 210.

The sector counter 209 counts the sectors of the current user data and increments the count by one, from the initial value of 0, each time updating the sector. Note that, because only the data of the even-number sector is treated while generating the EDC intermediate value 1 for the data of the region A, the sector counter 209 increments the count by two each time.

The selector 210 reads the value (EDC intermediate value) stored in the EDC buffer 211 according to the count value of the sector counter 209, outputs the value to the XOR circuit 208 and further writes the operation result of the XOR circuit 208 back to the EDC buffer 211.

At the time of the code generation, the EDC buffer 211 stores the EDC intermediate value 2 which is calculated by sequentially performing the XOR operation in the XOR circuit 208. At the time of the recording process, the EDC buffer 211 stores a result of sequentially performing the XOR operation in the XOR circuit 208 as the EDC and sends the obtained EDC to the integration unit 22. The EDC buffer 211 has a storage area that stores the above-described operation result for each sector. The LDC block of Blu-ray is composed of 32 sectors, and each operation result is 32 bits. Thus, the LDC block has 32-bit storage areas for 32 sectors, thus having storing units EDC_VALUE[0] to EDC_VALUE[31] corresponding thereto. Note that the value which is stored into each storage area corresponding to the odd-number sector of the EDC buffer 211 at the time of code generation is 0.

The selector 210 reads a value corresponding to the sector selected by the sector counter 209 from the EDC buffer 211 and sends the value to the XOR circuit 208. The XOR circuit 208 calculates the XOR of the output from the selection unit 207 and the selected value from the selector 210 and sends the result to the selector 210 again. The selector 210 writes the value back to a storing area of the corresponding sector in the EDC buffer 211.

Consequently, at the time point when all the user data in the regions A and B of the sectors 0 to 31 are input, the EDC intermediate value 2 obtained by sequentially calculating the XOR of each user data in the region in the latter half of the even-number sector (the row number Row=108 to 215, the column number in the sector M=0 to 8) and the corresponding expected value is stored in the EDC buffer 211.

The data control unit 16 transfers the data in the region A of the cluster N to the EDC generation block 20 in the sequence A and designates the plane 0 of the EDC buffer 211 to the EDC control unit. When a request for rewrite of the EDC table 201 is made from the EDC generation block 20, the value of the EDC expected value table is set to the EDC table 201. The EDC table stores the expected values corresponding to the respective areas and includes storing units of EDC_TABLE [0] to EDC_TABLE[18] corresponding to the columns 0 to 18 in the area. A specific method of setting is performed according to the following four conditions (1) to (4).

(1) When Row=0 and 108, the values of the EDC expected value tables 1[0] to [18] are set to EDC_TABLE[0] to EDC_TABLE[18].

(2) When $1 \leq Row \leq 107$ and Row=R1, the values of the EDC expected value tables 3[0] to [9] are set to EDC_TABLE [0] to EDC_TABLE[9].

(3) When $1 \leq Row \leq 107$ and Row=R2, the values of the EDC expected value tables 4[0] to [9] are set to EDC_TABLE [0] to EDC_TABLE[9].

(4) When $109 \leq Row \leq 215$ and Row=R2, the values of the EDC expected value tables 2[0] to [8] are set to EDC_TABLE [10] to EDC_TABLE[18].

Note that the above conditions (2) to (4) target only even-number sectors. The EDC expected value table 1 is a table of the initial expected values, and the EDC expected value table 2 has the initial values corresponding to R2 ($109 \leq R2 \leq 215$) in the above condition. Further, the EDC expected value table 3 has the initial values corresponding to R1 in the above condition, and the EDC expected value table 4 has the initial values corresponding to R2 ($1 \leq R2 \leq 107$) in the above condition. Only the EDC expected value table 1 contains nineteen expected values, and the EDC expected value tables 2 to 4 contain nine or ten expected values.

After that, the EDC generation block 20 generates the EDC intermediate value 1 according to the input data. At this point, the EDC intermediate value 1 is stored on the plane 0 of the EDC buffer 211. Next, the data control unit 16 transfers the data in the region B of the cluster N to the EDC generation block 20 in the sequence B, and designates the plane 0 of the EDC buffer 211 to the data control unit 16. After that, the EDC generation block 20 generates the EDC intermediate value 2 according to the input data. At this point, the EDC intermediate value 2 is stored on the plane 0 of the EDC buffer 211.

[Operation of EDC Generation Block]

An operation of the EDC generation block 20 is described hereinbelow. First, generation of the EDC intermediate value 1 and the EDC intermediate value 2 of the cluster N+1 which is performed in parallel with the recording process of the cluster N is described. The data control unit 16 confirms that there is a free space in the data memory 18, and then transfers the data in the sequence A of the cluster N+1 to the EDC generation block 20 and designates the plane 1 of the EDC buffer 211 to the data control unit 16. After that, the EDC generation block 20 generates the EDC intermediate value 1 according to the input data. At this point, the EDC intermediate value 1 is stored on the plane 1 of the EDC buffer 211.

Then, during the ECC recording period for recording the ECC onto a disc, because the ECC read out from the ECC buffer 26 is recorded, access for acquiring the recording data is not made to the data buffer 10. During this period, generation of the EDC intermediate value 2 of the cluster N+1 is performed.

The data control unit 16 transfers the data in the sequence B of the cluster N+1 to the EDC generation block 20 and designates the plane 1 of the EDC buffer 211 to the data control unit 16. After that, the EDC generation block 20 generates the EDC intermediate value 2 according to the input data. At this point, the EDC intermediate value 2 is stored on the plane 1 of the EDC buffer 211. Note that, for the plane 0 and the plane 1 of the EDC buffer 211, another plane of a plurality of planes may be used. However, the plane used in the code generation of the cluster N is used at the time of the recording of the cluster N.

[Generation Method of EDC Intermediate Values 1 and 2]

Hereinafter, a generation method of the EDC intermediate values 1 and 2 is described in detail.

The case where R2 is not at the head of the transfer block but in the middle thereof is described. It is assumed that there are L bytes from the row R2 in the transfer block to the final data in the column of the same block. The EDC generation block 20 initializes the sector counter 209 to 0, the column counter 204 to 0, the row counter 205 to R2, and the base row counter 202 to R2. Further, the EDC generation block 20 initializes the plane of the EDC buffer 211 designated from the data control unit 16 to all 0.

The EDC generation block 20 makes a rewrite request for the EDC table 201 to the data control unit 16 when the value of the row counter 205 is 0, 108, R1 and R2.

The expected value update rotation circuit 206 reads the initial value of the EDC expected value from the storing unit of the EDC table 201 corresponding to the count value of the column counter 204 through the selector 203. Specifically, if the count value of the column counter 204 is t, when the value of the row counter 205 satisfies $\leq 107$, the expected value update rotation circuit 206 reads the value from [t] of the EDC table 201 and, when the value of the row counter 205 satisfies $\geq 108$, the expected value update rotation circuit 206 reads the value from [t+10] of the EDC table 201.

The EDC generation block 20 obtains the data in the sequence A of the cluster N and, when the input bit is "1", the selection unit 207 selects the value of the expected value update rotation circuit 206, and when the input bit is "0", the selection unit 207 outputs 00000000h to the XOR circuit 208. The XOR circuit 208 performs the XOR operation with the value of EDC_VALUE[0], for example, indicated by the sector counter 209 through the selector 210. Specifically, at this time, the EDC intermediate value stored in the storing unit of EDC_VALUE[sector counter value: 0 to 31] is read out. The expected value update rotation circuit 206 updates the EDC expected value. The processing is performed in the same manner for eight bits, and then the row counter 205 is incremented by one.

After the above processing is performed up to the final data of the same column in the block, the column counter 204 is incremented by one, and the value of the base row counter 202 is set to the row counter 205. Each time the processing of eight bits ends and the row counter 205 is updated, it is confirmed whether the value of the row counter 205 is 0, 108, R1 and R2, and when the condition is satisfied, an EDC_TABLE rewrite request is made to the data control unit 16. Likewise, after processing ten columns when the value of the row counter 205 is ≦107, and nine columns when the value of the row counter 205 is ≧108, the column counter 204 is set to 0, and the sector counter 209 is incremented by two. Note that, in this processing and the following processing, that is, in the processing of the regions A and B, the sector counter 209 is incremented by two each time, and the value of the storage area of the EDC table indicated by the column counter 204 is read out to the expected value update rotation circuit 206 through the selector.

After that, at the point when the processing until the sector counter 209 reaches 30 and the column counter 204 reaches 8 ends, the processing on the data within one transfer block ends. At this time, the column counter 204 is set to 0, the sector counter 209 is set to 0, the number of bytes (L bytes or K bytes) processed up to the final data in the same column of the block is added to the base row counter 202, and the value of the base row counter 202 is set to the row counter 205. K bytes indicate the byte width in the column direction of the transfer block.

Further, the expected value update rotation circuit 206 which is updated after the processing on the least significant bit of the K-th byte of each column until the sector counter 209 reaches 30 and the column counter 204 is from 0 to 8 writes the value back to the corresponding area of the EDC_TABLE according to store instruction. The above processing is sequentially performed until reaching the final block, thereby generating the EDC intermediate value 1.

After that, the EDC generation block 20 initializes the sector counter 209 to 0, the column counter 204 to 0, the row counter 205 to R1, and the base row counter 202 to R1. It is assumed that there are P bytes from the row R1 in the transfer block to the final data in the column of the same block.

The EDC generation block 20 makes an EDC_TABLE rewrite request to the data control unit 16 when the value of the row counter 205 is 0, 108, R1 and R2.

The expected value update rotation circuit 206 reads the initial value of the EDC expected value of EDC_TABLE corresponding to the value of the column counter 204 through the selector 203. At this time, when the value of the column counter 204 is ≦107, the expected value update rotation circuit 206 reads the value from EDC_TABLE[Column] and, when the value of the column counter 204 is ≧108, it reads the value from EDC_TABLE[Column+10]. [Column] is the value of the column counter. EDC_TABLE[Column] indicates the value stored in the position corresponding to the column number of EDC_TABLE, and EDC_TABLE[Column+10] indicates the value (expected value) stored in the position corresponding to the column number +10 of EDC_TABLE.

The selection unit 207 obtains the data in the region B of the cluster N in the sequence B and, when the input bit is "1", the selection unit 207 outputs the value of the expected value update rotation circuit 206, and when the input bit is "0", it outputs 00000000h to the XOR circuit 208. Then, through the selector 210, when the count value of the sector counter 209 is Sector, the XOR circuit 208 performs the XOR operation with the value of EDC_VALUE[Sector]. At this time, the value stored in the storing unit of EDC_VALUE[sector counter value: 0 to 31] is read out. The expected value update rotation circuit 206 updates the EDC expected value. The processing is performed in the same manner for eight bits, and then the row counter 205 is incremented by one.

After the above processing is performed for P bytes, the column counter 204 is incremented by one, and the value of the base row counter 202 is set to the row counter 205. Each time the processing of eight bits ends and the row counter 205 is updated, it is confirmed whether the value of the row counter 205 is 0, 108 and R1, and when the condition is satisfied, an EDC_TABLE rewrite request is made to the data control unit 16. Likewise, after the processing ends for ten columns when the value of the row counter 205 is ≦107, or ends for nine columns when the value of the row counter 205 is ≧108, the column counter 204 is set to 0, and the sector counter 209 is incremented by two. Further, the value of the storage area of EDC_TABLE indicated by the column counter 204 is read out to the expected value update rotation circuit 206 through the selector.

[Generation Method of EDC]

A generation method of an EDC is described hereinbelow. The EDC generation block 20 initializes the sector counter 209 to 0, the row counter 205 to 0, the column counter 204 to 0, and the base row counter 202 to 0.

It is confirmed whether the value of the row counter 205 is 0, 108, and when the condition is satisfied, an EDC_TABLE rewrite request is made to the data control unit 16. Note that, when calculating the expected value of data in the region C, even when the count value of the row counter 205 is R1, R2, the initial value is not read from the EDC table 201, and the determination is not necessary.

The expected value update rotation circuit 206 reads the initial value of the EDC expected value from EDC_TABLE indicated by the column counter 204 through the selector 203. At this time, when the value of the row counter 205 is <108, the value is read in relation of EDC_TABLE[Column] and, when the value of the row counter 205 is ≧108, the value is read in relation of EDC_TABLE[Column+10].

Obtaining the data in the sequence C of the cluster N, when the input bit is "1", the selection unit 207 selects the value of the expected value update rotation circuit 206, and when the input bit is "0", the selection unit 207 outputs 00000000h to the XOR circuit 208. The XOR circuit 208 then writes the value obtained by the XOR operation with the value of EDC_VALUE indicated by the sector counter 209 to EDC_VALUE[0] through the selector 210. At this time, the EDC intermediate value stored in the storing unit of EDC_VALUE[sector counter value: 0 to 31] is read and written. The expected value update rotation circuit 206 updates the EDC expected value. The processing is performed in the same manner for eight bits, and then the row counter 205 is incremented by one.

After performing the above processing up to the final data of the same column in the block, or after performing it up to data just before R2 in the even-number sector, the column counter 204 is incremented by one, and the value of the base row counter 202 is set to the row counter 205. Each time the processing of eight bits ends and the row counter 205 is updated, it is confirmed whether the value of the row counter 205 is 0, 108, R1 and R2, and when the condition is satisfied, an EDC_TABLE rewrite request is made to the data control unit 16. Likewise, after the processing ends for ten columns when the value of the row counter 205 is ≦107, ends for nine columns when the value of the row counter 205 is ≧108, or ends for the value of the column counter 204 is nineteen columns, the column counter 204 is set to 0, and the sector counter 209 is incremented by one. Further, the value of the storage area of the EDC table 201 indicated by the column counter 204 is read out to the expected value update rotation circuit 206 through the selector 203.

After that, at the point when the processing until the count value of the sector counter 209 reaches 31, the count value of the column counter 204 reaches 18, and the count value of the row counter 205 reaches K−1 ends, the processing on the data within one transfer block ends. At this time, the value of the column counter 204 is set to 0, the count value of the sector counter 209 is set to 0, and K is added to the count value of the base row counter 202, and the value of the base row counter 202 is set to the count value of the row counter 205.

Further, the value of the expected value update rotation circuit 206 which is updated after the processing on the least significant bit of the K-th byte of each column until the count value of the sector counter 209 is 31 and the count value of the column counter is from 10 to 18 is written back to the corresponding area of the EDC table 201. The above processing is sequentially performed until reaching the final block, thereby generating the EDC.

Alternative Example of Exemplary Embodiment

An alternative example of the above-described exemplary embodiment is described hereinafter. In the exemplary embodiment described above, during the ECC recording period, buffer access for code generation is made and further only the user data of the region A, among the user data of the region A and the region B processed during the code generation, is stored into the data memory 18 for reuse. On the other hand, in this alternative embodiment, the region B is eliminated, so that the whole part is the region A. Specifically, it is equivalent to the case of R1=R2 in the example described above. Then, in this exemplary embodiment, all of data to be used for code generation are stored into the data memory 18.

Specifically, compared to the case of R1=R2 in the exemplary embodiment, the processing at R1 (the processing of the region B) is eliminated, and the EDC expected value table 3 has the same or similar values as the EDC expected value table 2, and the generation process of the EDC intermediate value 1 is the generation process of the EDC intermediate value 2.

Figure 30:
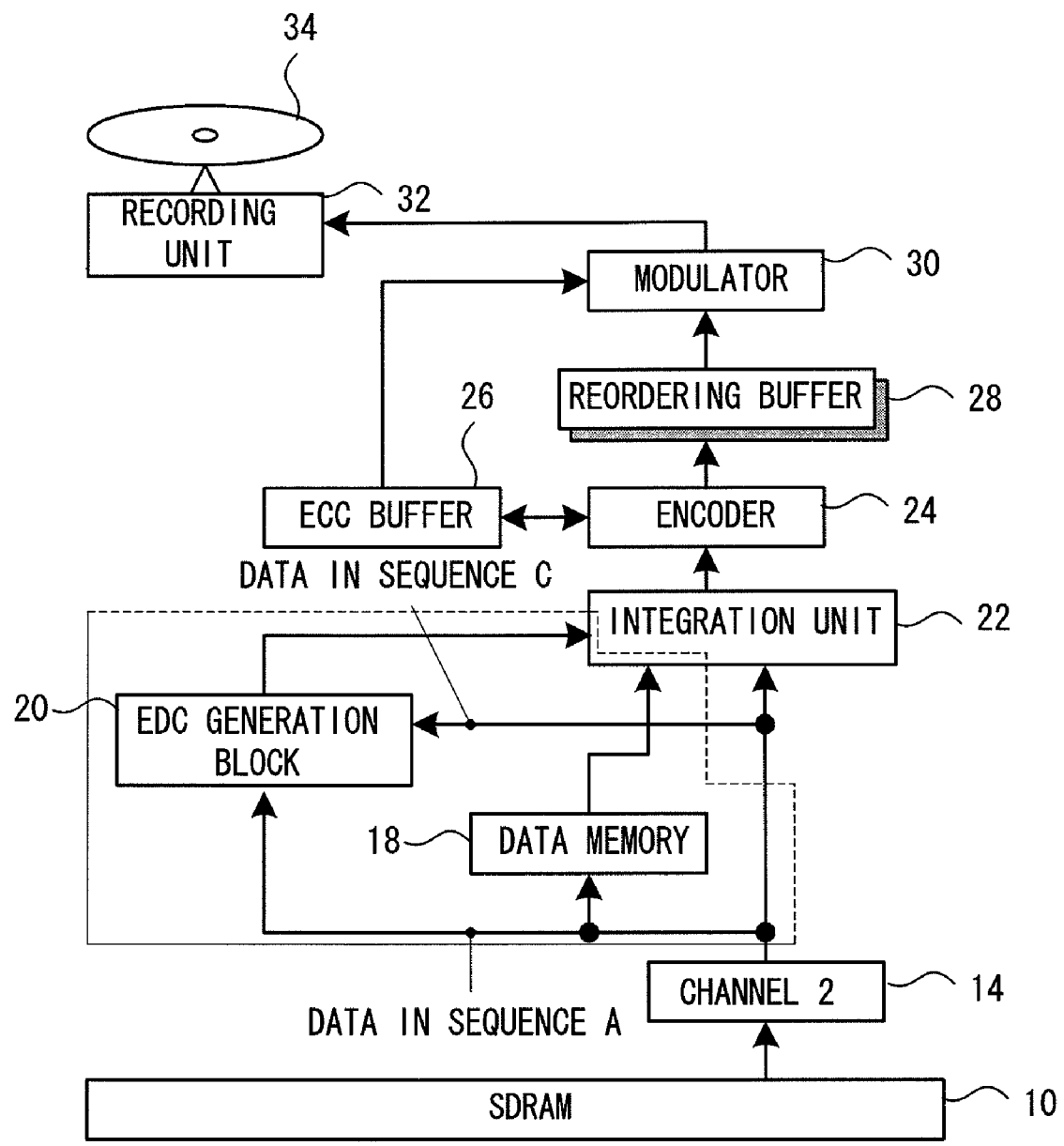
FIG. 30 is a view showing a recording apparatus according to a second exemplary embodiment of the present invention.
Figure 31:
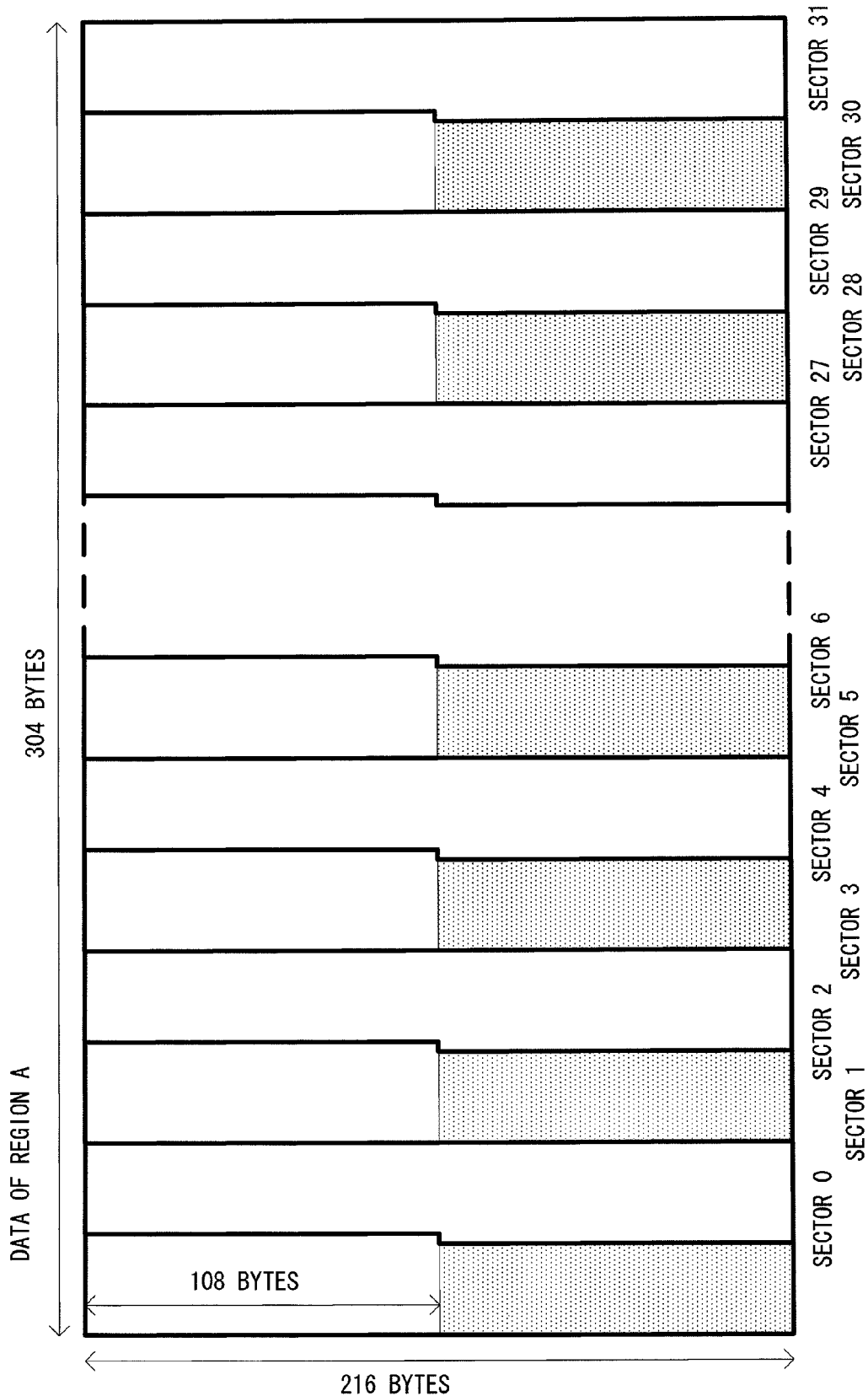
FIG. 31 is a view showing user data in a region A to be read out at the time of code generation in the second exemplary embodiment of the present invention.
Figure 32:
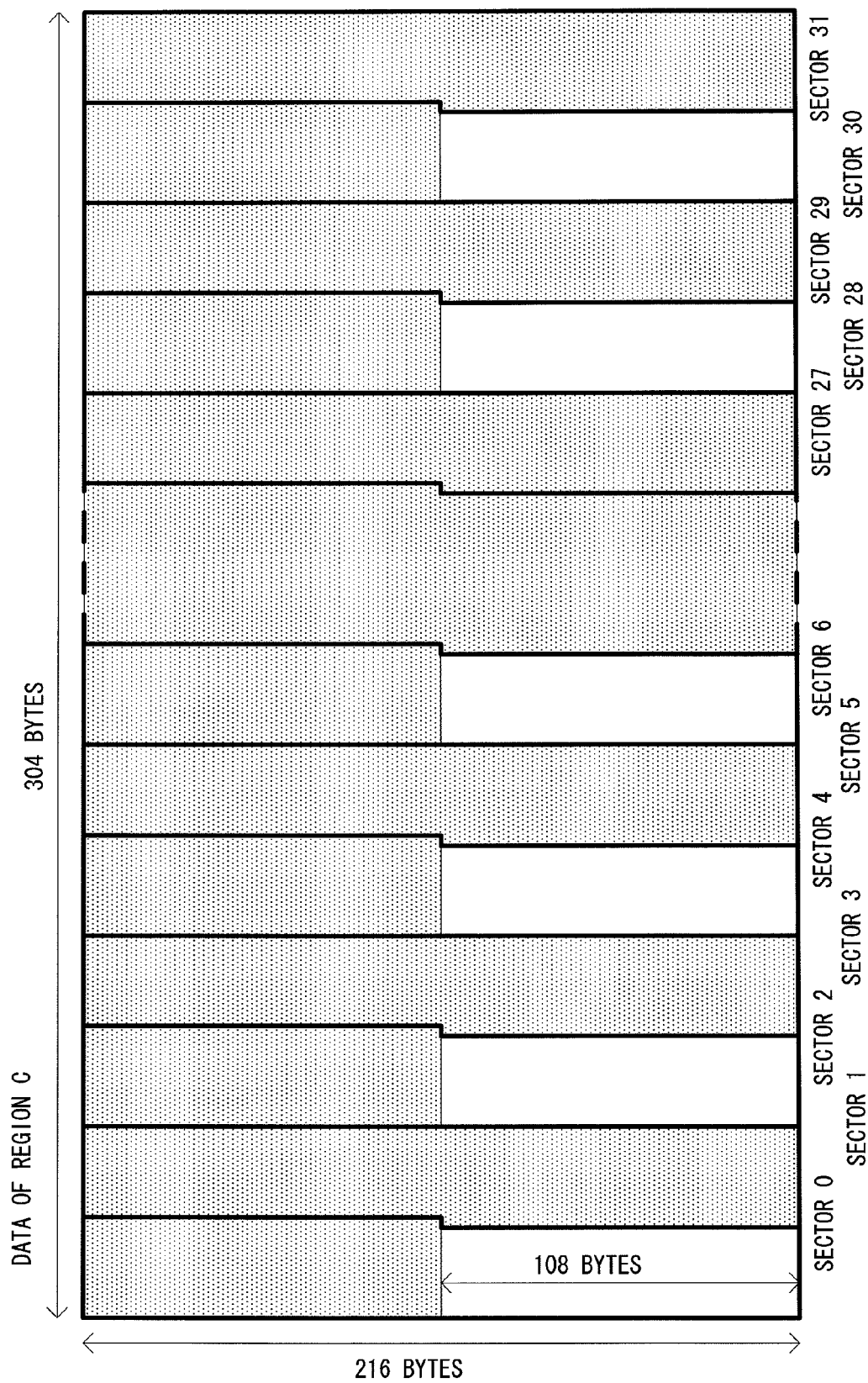
FIG. 32 is a view showing user data in a region C to be read out at the time of recording in the second exemplary embodiment of the present invention.

FIG. 30 is a view showing a recording apparatus according to the alternative embodiment. FIG. 31 is a view showing user data in a region A to be read out at the time of code generation in the alternative embodiment. FIG. 32 is a view showing user data in a region C to be read out at the time of recording in the alternative embodiment.

In the above exemplary embodiment, the sequence of reading is different between the region A and the region B and therefore two channels are used. In this exemplary embodiment, on the other hand, only the region A and the region C are present, and the data in the sequence C, which is the sequence of reading of those regions, contains the data in the region A, and it is therefore possible to use the channel 2 (14) in common and eliminate the channel 1. Further, it is not necessary to sort the user data to the data memory 18 and the EDC generation block 20, and the user data in the region A is simply input to the data memory 18 and the EDC generation block 20, so that the data control unit can be also eliminated.

Advantage of Exemplary Embodiment

An advantage of the exemplary embodiment is described hereinbelow. In this exemplary embodiment, in an apparatus that records data in the user data direction and the recording direction onto an optical disc, the EDC generation block 20 generates the EDC intermediate value 1 from the data in the sequence A and then generates the EDC intermediate value 2 from the EDC intermediate value 1 and the data in the sequence B (in the user data direction). Further, the data acquired at time of code generation is stored in the data memory 18 and the data is reused at the time of recording, thereby partly eliminating buffer access during the recording. It is thereby possible to reduce the load of the buffer access and enable high speed recording.

In this configuration, as a first advantageous effect, it is possible to solve the problem that the code generation and the recording process are executed in parallel and the data recording is concentrated on the first 432 frames. This is because the data acquired at the time of the code generation is stored and reused at the time of the recording.

As a second advantageous effect, it is possible to reduce power consumption. This is because high frequency operation of the buffer is not needed as a result of the decentralization of the data buffer (SDRAM) access.

As a third advantageous effect, it is possible to reduce costs. This is because the need for a high frequency operating buffer (SDRAM) is eliminated as a result of the decentralization of the data buffer (SDRAM) access.

Figure 33A:
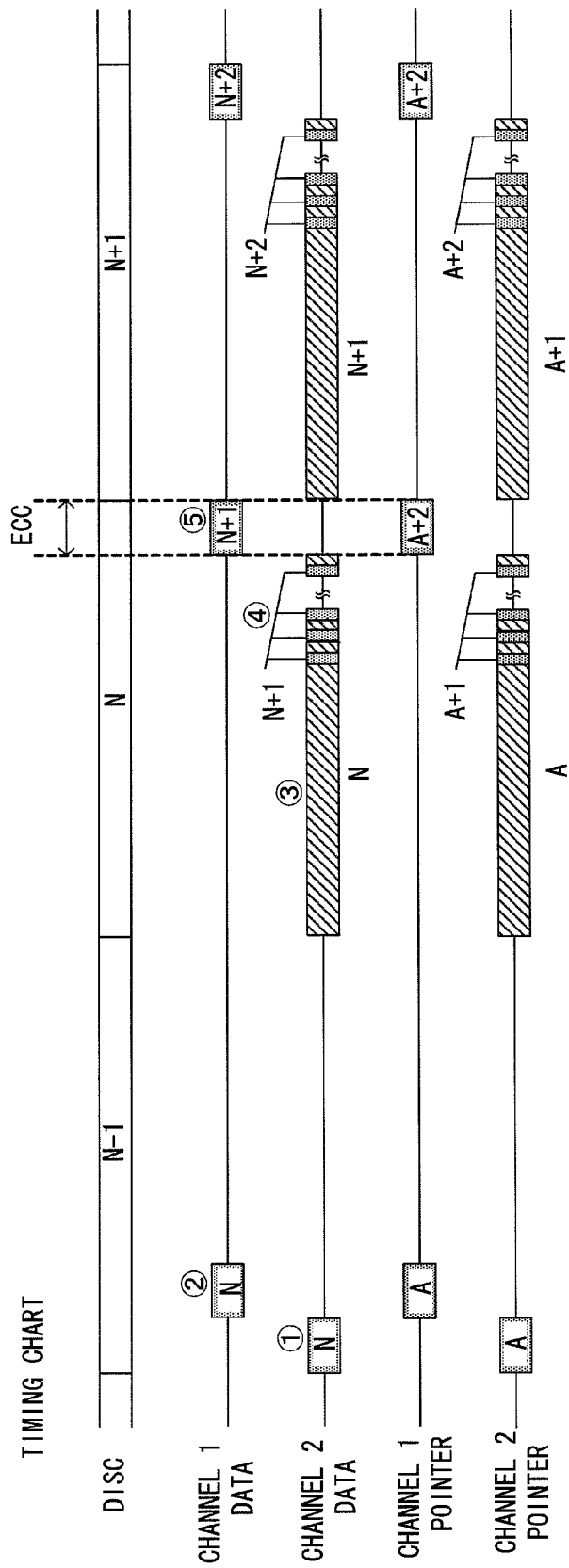
FIGS. 33A and 33B are views showing timing charts of a recording apparatus according to the first exemplary embodiment of the present invention.
Figure 33B:
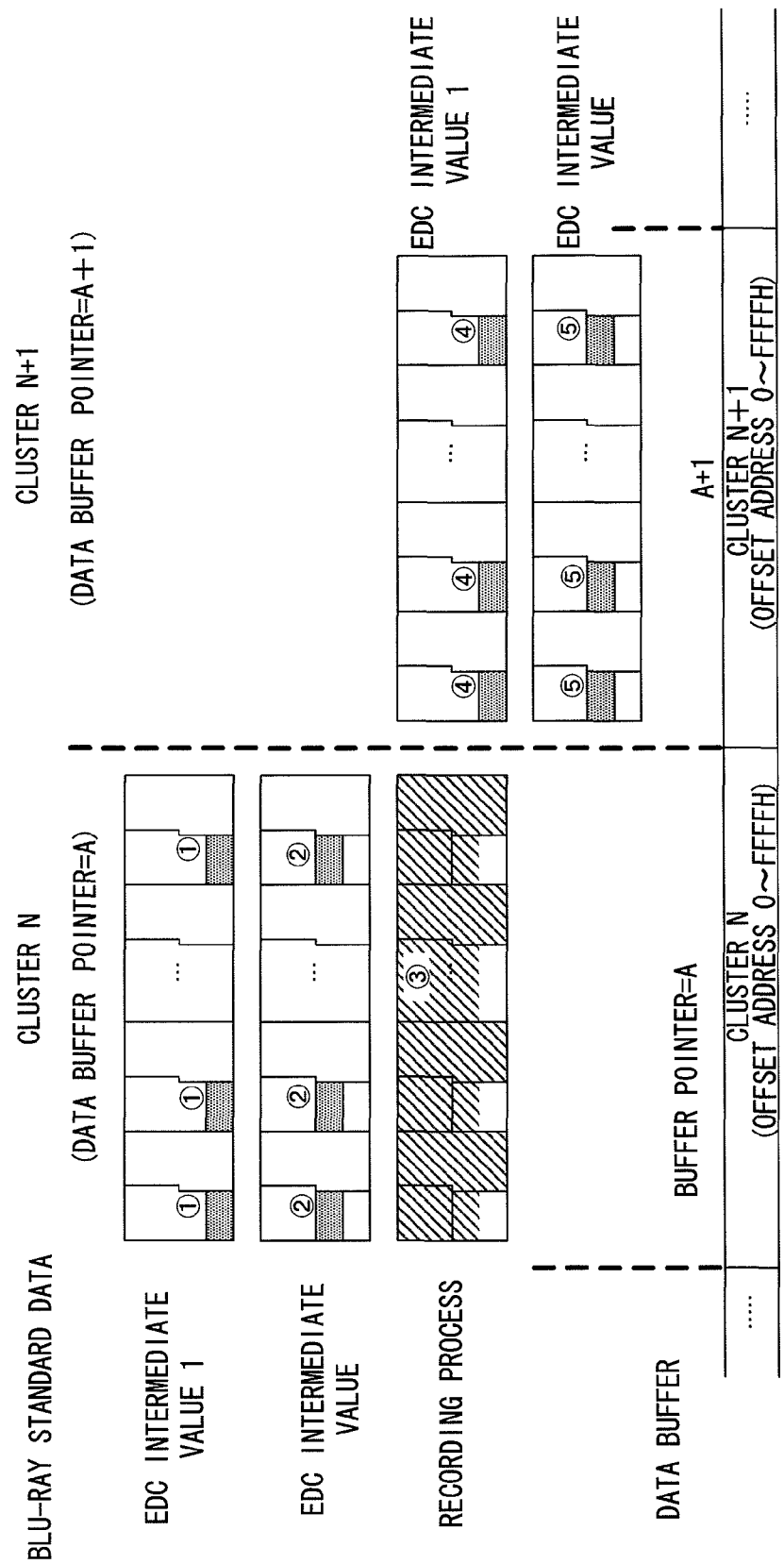
Figure 34:
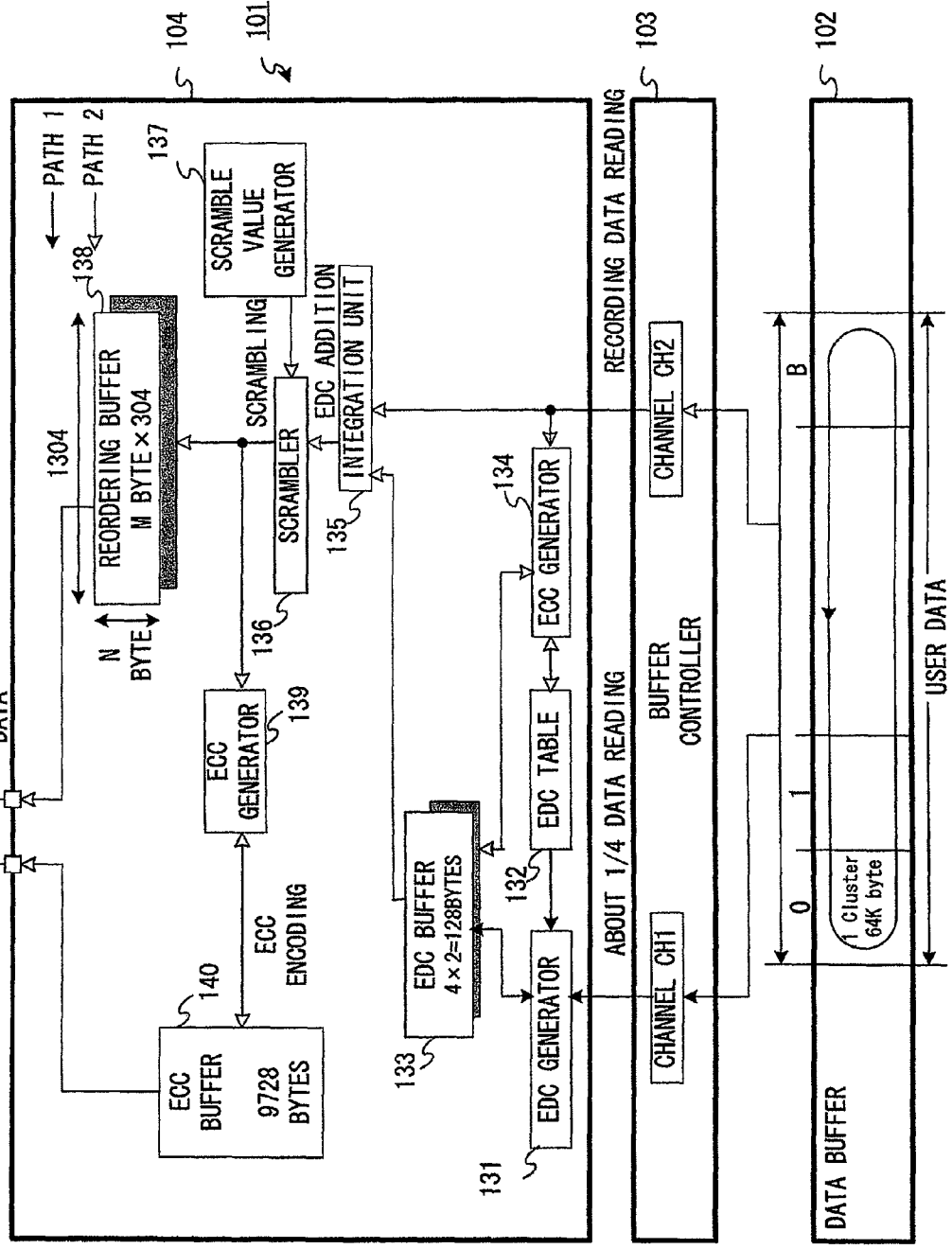
FIG. 34 is a view showing a Blu-ray disc recording apparatus disclosed in Ariyama.
Figure 35:
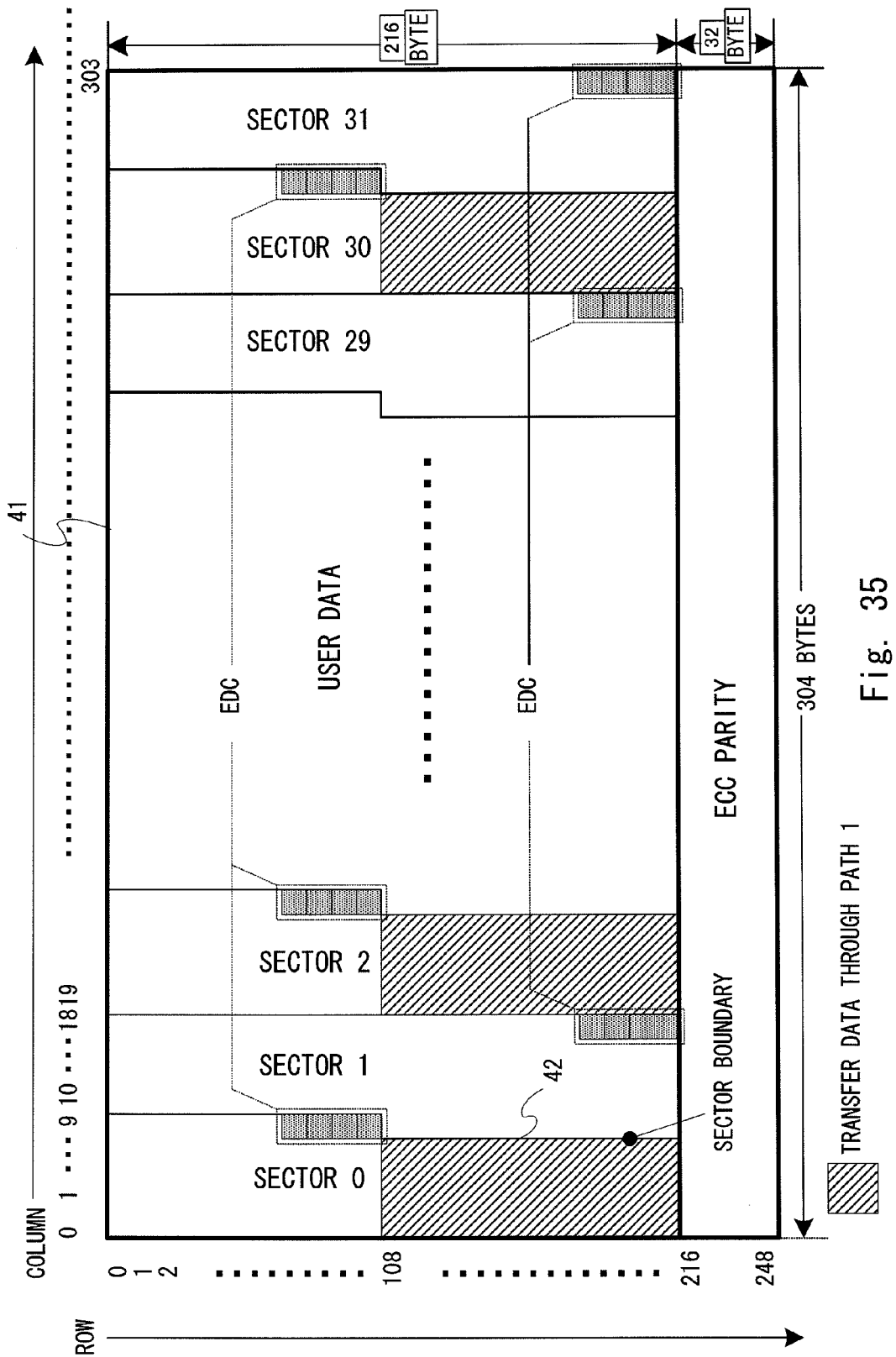
FIG. 35 is a view to illustrate user data used in paths 1 and 2 in the reference 2.
Figure 36:
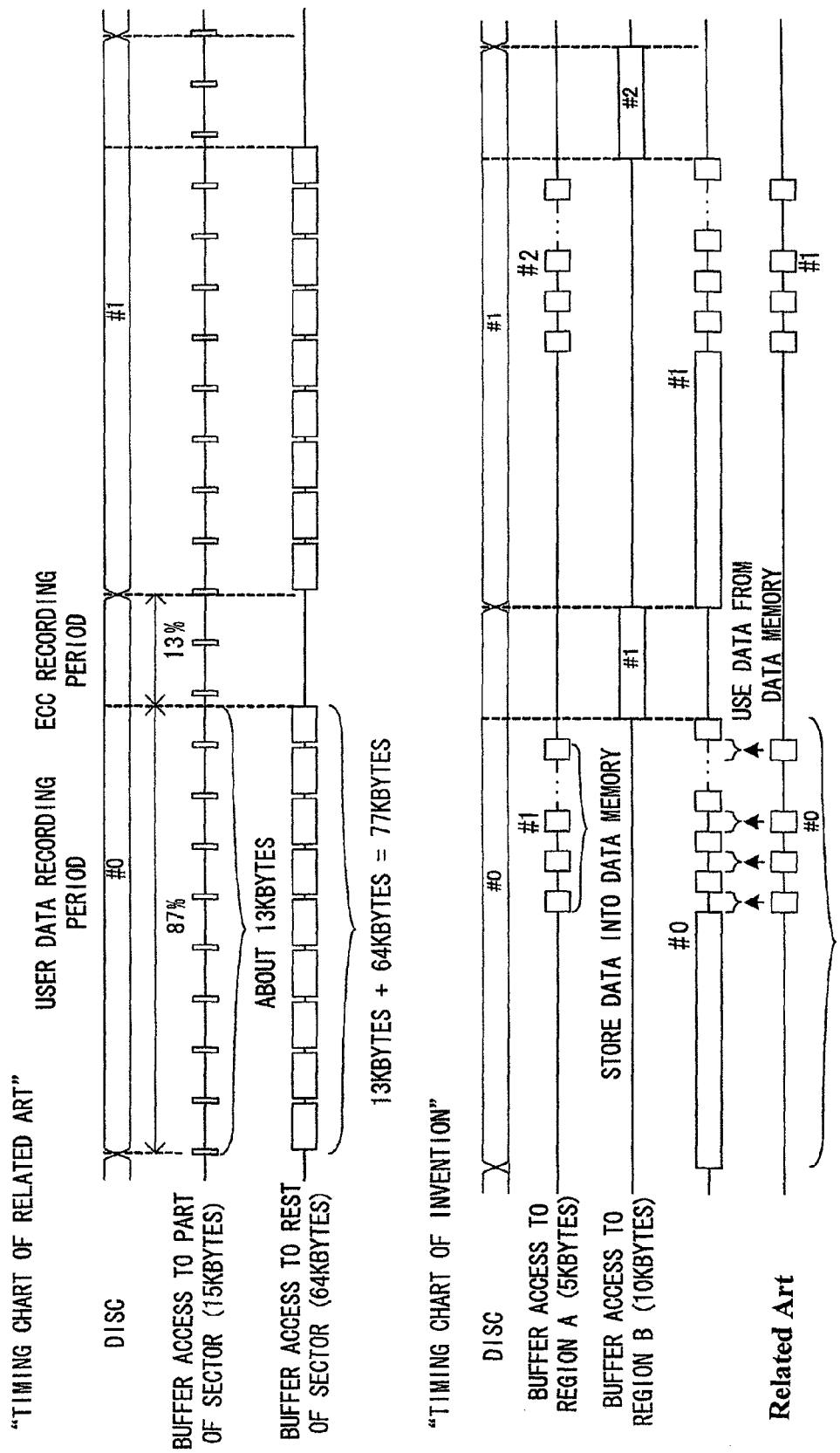
FIG. 36 is a timing chart of the recording apparatus disclosed in Ariyama.
Figure 37:
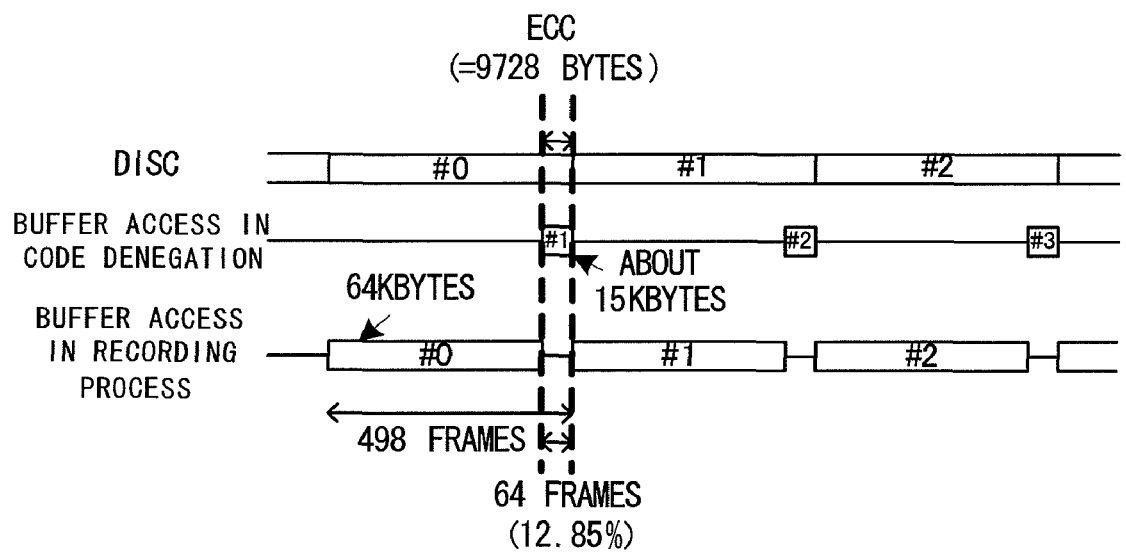
FIG. 37 is a view showing another example of a timing chart of a recording apparatus.

FIGS. 33A and 33B are views showing a timing chart of a recording apparatus according to the first exemplary embodiment of the present invention. The channel 1 corresponds to the pointer 1, and the channel 2 corresponds to the pointer 2. In the cluster N (the first cluster), only the code generation is performed.

In the next cluster N, the code generation and the recording are executed in parallel. At this time, the processing of data in the region C is started firstly in the recording process. Upon completion of the processing up to R1=108 in the region C, user data of the region A and user data of the region C are read out alternately in the even-number sector and the odd-number sector. In this case, because the region A is stored in the data memory 18, the user data in the even-number sector is read out from the data memory 18.

On the other hand, during this period, the channel 2 acquires data from the data buffer. At this time, the code generation 1 of the cluster N+1 is performed. Specifically, user data in the region A of the cluster N+1 is read out and stored into the EDC generation block 20 and a free space of the data memory 18. This avoids concentration of the data recording on the first 432 frames. This is because the data acquired at the time of the code generation 1 is stored and reused for the recording.

Further, because of the decentralization of the data buffer (SDRAM) access, high frequency operation of the buffer is not needed, and power consumption can be reduced. Further, because of the decentralization of the data buffer (SDRAM) access, the need for a high frequency operating buffer (SDRAM) is eliminated, and costs can be reduced.

It should be noted that the present invention is not limited to the above-described exemplary embodiments, and various changes and modifications may be made without departing from the scope of the invention.

For example, although a hardware configuration is described in the above exemplary embodiments, the present invention is not limited thereto, and given processing may be implemented by executing a computer program on a central processing unit (CPU). In this case, the computer program may be provided by being recorded on a recording medium or by being transmitted through the Internet or other transmission media.

Further, the first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, in the above exemplary embodiment, the data receiving device is explained as hardware. However, an arbitrary processing can be achieved by executing a program by CPU (Central Processing Unit). The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

What is claimed is:

1. A recording apparatus that calculates an error detecting code for detecting an error in a user data code string having a first sequence, where a unit of processing is a block including two or more sectors containing the user data code string, the block including a first sector and a second sector, the first sector and the second sector having a structure that the error detecting code is appeared in an end of the user data code string when reading data in the first sequence, and the first sector having a structure that the error detecting code is appeared in a middle of reading the user data code string when reading data in a second sequence different from the first sequence, the recording apparatus comprising:
   a first operation unit that reads first data in a first region at least including data to be read out after the error detecting code when reading data in the second sequence in the first sector from a data buffer that stores the block and calculates an error detecting code intermediate value from the first data;
   a data memory that stores at least part of the first data used for operation by the first operation unit;
   a second operation unit that reads data excluding the first data in the first region from the block as second data from the data buffer and calculates the error detecting code based on the second data and the error detecting code intermediate value; and
   an integration unit that integrates the first data, the second data and the error detecting code, wherein
   the integration unit receives the error detecting code and the second data from the second operation unit, receives the first data from the data memory, and integrates and outputs the received error detecting code and the first and second data.

2. The recording apparatus according to claim 1, wherein, while sending the first data from the data memory to the integration unit, the first operation unit reads the first data in a next block from the data buffer and calculates a first error detecting code intermediate value.

3. The recording apparatus according to claim 1, wherein, while recording the error correcting code calculated from the block onto a disc, the first operation unit reads the first data in a next block from the data buffer and calculates the error detecting code intermediate value.

4. The recording apparatus according to claim 1, wherein the first data has first main data stored in the data memory and first sub-data used only for generation of the error detecting code intermediate value.

5. The recording apparatus according to claim 4, wherein
   while sending the first main data from the data memory to the integration unit, the first operation unit reads the first main data in a next block from the data buffer and calculates a first error detecting code intermediate value, and
   while recording the error correcting code calculated from the block onto a disc, the first operation unit reads the first sub-data in a next block from the data buffer and calculates a second error detecting code intermediate value.

6. The recording apparatus according to claim 4, wherein
   the block is composed of K rows×L columns (K and L are positive integers), and
   the first data and the first main data are user data stored in a first area and a first main area, respectively, of a row with a row number R2 ($0 \leq R2 < K$) to a final row in the first sector.

7. The recording apparatus according to claim 4, wherein
   the block is composed of K rows×L columns (K and L are positive integers), and
   the first sub-data is user data stored in a first sub-area of a row with a row number R1 ($0 \leq R1 < R2 < K$) to a row just before the row with the row number R2 in the first sector.

8. The recording apparatus according to claim 4, wherein
   the block can be represented as (k rows×L columns)×M (k, L and M are positive integers), and the block of k rows×L columns is a transfer block,
   the first data and the first main data are user data stored in a first area and a first main area, respectively, in the first sector,
   the first operation unit reads the first data or the first main data from the data buffer in a sequence A, and
   the sequence A is a sequence in ascending order of transfer block in area, in ascending order of column in transfer block, and in ascending order of row in column, in the first area or the first main area.

9. The recording apparatus according to claim 4, wherein
   the block can be represented as (k rows×L columns)×M (k, L and M are positive integers), and the block of k rows×L columns is a transfer block,
   the second data is user data stored in a second area where data different from the first main data in the block is stored,
   the second operation unit reads the second data from the data buffer in a sequence C, and
   the sequence C is a sequence in ascending order of transfer block in area, in ascending order of column in transfer block, and in ascending order of row in column, in the second area.

10. The recording apparatus according to claim 4, wherein
    the block can be represented as (k rows×L columns)×M (k, L and M are positive integers), and the block of k rows×L columns is a transfer block,
    the first sub-data is user data stored in a first sub-area in the first sector,
    the first operation unit reads the first sub-data from the data buffer in a sequence B, and
    the sequence B is a sequence in ascending order of column in area and in ascending order of row in column, in the first sub-area.

11. The recording apparatus according to claim 1, further comprising:
a reordering buffer that stores the user data and the error detecting code from the integration unit, wherein
when the block can be represented as (k rows×L columns)×M (k, L and M are positive integers), and the block of k rows×L columns is a transfer block,
the reordering buffer outputs data input in the first sequence in the second sequence.

12. The recording apparatus according to claim 1, wherein the first sequence is a sequence in a user data direction, and the second sequence is a sequence in a recording direction.

13. The recording apparatus according to claim 11, wherein the reordering buffer stores data in ascending order of column in transfer block and in ascending order of row in column, and outputs data in ascending order of row in transfer block and in ascending order of column in row.

14. The recording apparatus according to claim 6, wherein the row with the row number R2 is a row at or before a row just after a final row of the error detecting code appeared in the first sector.

15. The recording apparatus according to claim 2, wherein, when one byte is data where one row and one column overlaps, the block is composed of 216 rows ($0 \leq K \leq 215$) and 304 columns ($0 \leq L \leq 303$) and satisfies following relationships:
$0 \leq R1 \leq 108$,
$0 \leq R2 \leq 215$,
$0 \leq P \leq 215$, and
$R2-R1=P$.

16. The recording apparatus according to claim 1, wherein
the block contains user data included in a cluster being a minimum unit of recording onto a disc,
the first sequence is a coding sequence of the user data corresponding to a column direction of the block, and
the second sequence is a recording sequence of the user data corresponding to a row direction of the block.

17. The recording apparatus according to claim 1, wherein
the block includes the first sector and the second sector,
the error detecting code is appeared in a middle of a final column of the first sector, and
the error detecting code is appeared in an end of a final column of the second sector.

18. The recording apparatus according to claim 4, wherein
the user data is burst-transferred from the data buffer,
the k bytes is a burst transfer size, and
the error detecting code is the k bytes or less.

19. The recording apparatus according to claim 1, wherein
the error detecting code is obtained by performing predetermined operation on a sector of i bytes where 0 data of the same bytes as the error detecting code is added to the user data code string in the first sequence,
when, in the code string of the i bytes associated with the first sequence, a result of performing the predetermined operation by setting only a bit of the input user data corresponding to the first sequence to 1 and other bits to 0 is an expected value of the bit,
the first operation unit calculates the error detecting code intermediate value by sequentially obtaining XOR of the expected value when a bit of the input first data is 1, and
the second operation unit calculates the error detecting code by sequentially obtaining XOR of the error detecting code intermediate value and the expected value when a bit of the input second data is 1.

20. The recording apparatus according to claim 19, wherein
the first operation unit and the second operation unit refer to an initial expected value being an expected value corresponding to a particular bit in the user data code string and calculates the expected value based on the initial expected value.

21. The recording apparatus according to claim 19, wherein
the second operation unit refers to an initial expected value being an expected value corresponding to a most significant bit of a first row in the block and calculates the expected value based on the initial expected value, and
the first operation unit refers to a reference expected value being an expected value corresponding to a most significant bit of a row with a row number R1, R2 and calculates the expected value based on the reference expected value.

22. The recording apparatus according to claim 19, wherein
the block has an area composed of a pair of the first sector and the second sector, and
the initial expected value and the reference expected value are expected values of a most significant bit of a first row in the area and a most significant bit of a row with a row number R1, R2.

23. A recording method of calculating an error detecting code for detecting an error in a user data code string having a first sequence, where a unit of processing is a block including two or more sectors containing the user data code string, the block including a first sector and a second sector, the first sector and the second sector having a structure that the error detecting code is appeared in an end of the user data code string when reading data in the first sequence, and the first sector having a structure that the error detecting code is appeared in a middle of reading the user data code string when reading data in a second sequence different from the first sequence, the recording method comprising:
reading first data in a first region at least including data to be read out after the error detecting code when reading data in the second sequence in the first sector from a data buffer that stores the block, and calculating an error detecting code intermediate value from the first data;
reading data excluding the first data in the first region from the block as second data from the data buffer, and calculating the error detecting code based on the second data and the error detecting code intermediate value; and
receiving the error detecting code and the second data, receiving the first data from a data memory that stores at least part of the first data used for operation, and integrating and outputting the received error detecting code and the first and second data.

24. The recording method according to claim 23, wherein, while sending the first data from the data memory, the first data in a next block is read from the data buffer, and a first error detecting code intermediate value is calculated.

25. The recording method according to claim 23, wherein, while recording the error correcting code calculated from the block onto a disc, the first data in a next block is read from the data buffer, and a second error detecting code intermediate value is calculated.

26. The recording method according to claim 23, wherein the first data has first main data stored in the data memory and first sub-data used only for generation of the error detecting code intermediate value.

27. The recording method according to claim 26, wherein, when calculating the error detecting code intermediate value,
while sending the first main data from the data memory, the first main data in a next block is read from the data buffer, and a first error detecting code intermediate value is calculated, and while recording the error correcting code calculated from the block onto a disc, the first sub-data in a next block is read from the data buffer, and a second error detecting code intermediate value is calculated.

28. The recording method according to claim 23, wherein,
the block is composed of K rows×L columns (K and L are positive integers), and
the first data and the first main data are user data stored in a first area and a first main area, respectively, of a row with a row number R2 ($0 \leq R2 < K$) to a final row in the first sector.

29. The recording method according to claim 23, wherein,
the block is composed of K rows×L columns (K and L are positive integers), and
the first sub-data is user data stored in a first sub-area of a row with a row number R1 ($0 \leq R1 < R2 < K$) to a row just before the row with the row number R2 in the first sector.

30. The recording method according to claim 26, wherein,
the block can be represented as (k rows×L columns)×M (k, L and M are positive integers), and the block of k rows×L columns is a transfer block,
the first data and the first main data are user data stored in a first area and a first main area, respectively, in the first sector,
when calculating the error detecting code intermediate value, the first data or the first main data is read from the data buffer in a sequence A, and
the sequence A is a sequence in ascending order of transfer block in area, in ascending order of column in transfer block, and in ascending order of row in column, in the first area or the first main area.

31. The recording method according to claim 26, wherein,
the block can be represented as (k rows×L columns)×M (k, L and M are positive integers), and the block of k rows×L columns is a transfer block,
the second data is user data stored in a second area where data different from the first main data in the block is stored,
when calculating the error detecting code intermediate value, the second data is read from the data buffer in a sequence C, and
the sequence C is a sequence in ascending order of transfer block in area, in ascending order of column in transfer block, and in ascending order of row in column, in the second area.

32. The recording method according to claim 26, wherein,
the block can be represented as (k rows×L columns)×M (k, L and M are positive integers), and the block of k rows×L columns is a transfer block,
the first sub-data is user data stored in a first sub-area in the first sector,
when calculating the error detecting code intermediate value, the first sub-data is read from the data buffer in a sequence B, and
the sequence B is a sequence in ascending order of column in area and in ascending order of row in column, in the first sub-area.

\* \* \* \* \*